(12) United States Patent
Lee et al.

(10) Patent No.: US 11,256,563 B2
(45) Date of Patent: Feb. 22, 2022

(54) MEMORY CONTROLLER WITH HIGH DATA RELIABILITY, A MEMORY SYSTEM HAVING THE SAME, AND AN OPERATION METHOD OF THE MEMORY CONTROLLER

(71) Applicant: SAMSUNG ELECTRONICS CO., LTD., Suwon-si (KR)

(72) Inventors: Jeongho Lee, Gwacheon-si (KR); Youngjin Cho, Seoul (KR); Seungwon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 86 days.

(21) Appl. No.: 16/882,601

(22) Filed: May 25, 2020

(65) Prior Publication Data

US 2021/0055985 A1 Feb. 25, 2021

(30) Foreign Application Priority Data

Aug. 23, 2019 (KR) .................... 10-2019-0103985

(51) Int. Cl.
*G11C 29/44* (2006.01)
*G06F 11/10* (2006.01)
(Continued)

(52) U.S. Cl.
CPC ......... *G06F 11/1004* (2013.01); *H03M 13/09* (2013.01); *H03M 13/251* (2013.01)

(58) Field of Classification Search
CPC ............ G06F 11/1004; G06F 11/1012; G06F 13/1668; G06F 11/1044; G06F 11/1048;
(Continued)

(56) References Cited

U.S. PATENT DOCUMENTS 7,636,262 B2 12/2009 Kim et al.
9,274,888 B2 3/2016 Chun et al.
(Continued)

FOREIGN PATENT DOCUMENTS

JP 2015-018451 1/2015
KR 10-2015-0073717 7/2015
(Continued)

OTHER PUBLICATIONS

European Search Report issued in corresponding European Patent Application No. EP 20164889.6 dated Oct. 6, 2020.
(Continued)

*Primary Examiner* — Albert Decady
*Assistant Examiner* — Enam Ahmed
(74) *Attorney, Agent, or Firm* — F. Chau & Associates, LLC

(57) ABSTRACT

A memory controller including: a fault determination circuit to receive first parity, second parity, and data read out from a first row of a memory device, and determine, based on a result of a first error detection operation using the first parity and a result of a second error detection operation using the second parity, whether the first row is faulty; a parity storage circuit to store a repair parity for repairing a fault of a row of a plurality of rows of the memory device, wherein the plurality of rows constitutes a repair unit, and wherein the repair unit includes the first row and one or more second rows; and a recovery circuit to repair a fault of the first row by using data of at least one of the second rows and the repair parity, when the first row is determined to be a faulty row.

19 Claims, 15 Drawing Sheets

(51) Int. Cl.
*H03M 13/09* (2006.01)
*H03M 13/25* (2006.01)

(58) Field of Classification Search
CPC .. G06F 3/0619; G06F 3/0658; G06F 12/0804; H03M 13/09; H03M 13/251; G11C 29/886; G11C 29/52; G11C 29/028; G11C 20/021; G11C 29/72; G11C 29/81; G11C 20/025; G11C 29/74; G11C 2029/4402; G11C 29/76; G11C 29/4401; G11C 29/42
USPC ............................................................ 714/1
See application file for complete search history.

(56) References Cited

U.S. PATENT DOCUMENTS

| | | | |
|---|---|---|---|
| 9,507,675 | B2 | 11/2016 | Chun et al. |
| 9,778,984 | B1 | 10/2017 | Plants |
| 9,804,920 | B2 | 10/2017 | Ping et al. |
| 10,521,303 | B2 | 12/2019 | Kim et al. |
| 10,713,112 | B2 | 7/2020 | Kim et al. |
| 2009/0292968 | A1 | 11/2009 | Cypher |
| 2014/0164879 | A1* | 6/2014 | Tam ............... G06F 11/1012 714/773 |
| 2015/0019933 | A1 | 1/2015 | Yamazaki et al. |
| 2015/0178155 | A1 | 6/2015 | Kim et al. |
| 2016/0196180 | A1 | 7/2016 | Kim et al. |
| 2017/0169905 | A1 | 6/2017 | Walton et al. |
| 2018/0374552 | A1* | 12/2018 | Hong .............. G06F 11/1068 |
| 2019/0138230 | A1* | 5/2019 | Lim ................ G06F 3/0655 |
| 2019/0187902 | A1* | 6/2019 | Lee ................ G06F 11/1048 |
| 2020/0104208 | A1* | 4/2020 | Heo ................ G06F 3/0619 |

FOREIGN PATENT DOCUMENTS

| | | |
|---|---|---|
| KR | 10-2016-0008786 | 1/2016 |
| KR | 10-2018-0008219 | 1/2018 |
| KR | 10-2018-0138394 | 12/2018 |

OTHER PUBLICATIONS

Korean Office Action issued in corresponding KR Patent Application No. 2019-103985 dated Jan. 15, 2021.

\* cited by examiner

FIG. 8A

|  | Cache | Memory |
|---|---|---|
| Read | Parity update × | Parity Update |
| Write | Valid entry Existence of valid entry : Parity update ×<br>Valid entry Non-existence of valid entry:<br>Existing Data Read & Parity update | Parity Update |
| Evict | Parity Update | – |

FIG. 8B

|  | Cache | Memory |
|---|---|---|
| Read | Parity Update × | Parity Update |
| Write | Parity Update × | Parity Update |
| Evict | Parity Update using Old Data & Parity Update using New Data | – |

MEMORY CONTROLLER WITH HIGH DATA RELIABILITY, A MEMORY SYSTEM HAVING THE SAME, AND AN OPERATION METHOD OF THE MEMORY CONTROLLER

CROSS-REFERENCE TO RELATED APPLICATION

This application claims priority under 35 U.S.C. § 119 to Korean Patent Application No. 10-2019-0103985, filed on Aug. 23, 2019, in the Korean Intellectual Property Office, the disclosure of which is incorporated by reference herein in its entirety.

TECHNICAL FIELD

The inventive concept relates to memory controllers, and more particularly, to a memory controller with high data reliability, a memory system including the memory controller, and an operation method of the memory controller.

DISCUSSION OF RELATED ART

Both the capacity and speed of semiconductor memory devices which are widely used in high-performance electronic systems are increasing. Dynamic random-access memory (DRAM), which is an example of semiconductor memory, is volatile memory, and determines data according to the charge stored in a capacitor. For example, the capacitor can either be charged or discharged and these two states are taken to represent the two values of a bit.

Memory controllers can control a memory operation including data write and read operations with respect to a memory device. For example, to increase the reliability of data, memory controllers may generate parity information from the data and may store the parity information in the memory device. The memory controllers may perform error detection and correction operations with respect to the data by using the parity information. For example, a 1-bit error correction, 2-bit error detection or single-error correcting and double-error correcting, abbreviated as (SECDED), logic is applicable to memory controllers. However, only an error of one bit can be corrected using such error detection/correction logic. Thus, countermeasures against chip kill and reliability reduction due to process shrinkage, as well as row and bank faults may not be effectively undertaken.

SUMMARY

According to an exemplary embodiment of the inventive concept, there is provided a memory controller for communicating with a memory device, the memory controller including: a fault determination circuit configured to receive a first parity, a second parity, and data read out from a first row of the memory device, and determine, based on a result of a first error detection operation using the first parity and a result of a second error detection operation using the second parity, whether the first row is faulty; a parity storage circuit configured to store a repair parity for repairing a fault of a row of a plurality of rows of the memory device, wherein the plurality of rows constitutes a repair unit, and wherein the repair unit includes the first row and one or more second rows; and a recovery circuit configured to repair a fault of the first row by using data of at least one of the second rows and the repair parity, when the first row is determined to be a faulty row.

According to another exemplary embodiment of the inventive concept, there is provided an operation method of a memory controller, the operation method including: receiving a write request and write data for a first row of a memory device from a host; generating, from the write data, first parity for use in a first error detection operation and second parity for use in a second error detection operation; storing the first parity and the second parity in the memory device; generating a repair parity for repairing a default of each row of a repair unit using the write data, wherein the repair unit includes the first row and one or more second rows; storing the repair parity in a storage circuit; and determining whether the first row is faulty, based on a result of an error detection operation using the first and second parities, when a read request for the first row is received from the host.

According to another exemplary embodiment of the inventive concept, there is provided a memory system including a memory device including a memory cell array including a first region for storing normal data and a second region for storing parities; and a memory controller configured to control a memory operation of the memory device, wherein the memory controller includes: a fault determination circuit configured to receive a first parity for use in a first error detection operation, a second parity for use in a second error detection operation, and data read from a first row of the memory device, and determine, based on a result of the first error detection operation and a result of the second error detection operation, whether the first row is faulty; a parity storage circuit configured to store a repair parity for repairing a fault of each row of a repair unit including the first row and one or more second rows; and a recovery circuit configured to repair a fault of the first row by using data of at least one of the second rows and the repair parity, when the first row is determined to be a faulty row.

According to another exemplary embodiment of the inventive concept, there is provided a memory controller for communicating with a memory device, the memory controller including: fault determination circuit including an error-correcting code (ECC) circuit and a cyclic redundancy check (CRC) circuit, wherein the fault determination circuit determines whether a first row of the memory device from which data has been read is faulty, based on a first error detect operation performed by the ECC circuit using a ECC parity and a second error detect operation performed by the CRC circuit using a CRC parity; and a recovery circuit configured to repair the data of the first row by using data of other rows of the memory device constituting a repair unit and a repair parity when the data of the first row is determined to be faulty, wherein the repair unit includes the first row and the other rows.

BRIEF DESCRIPTION OF THE DRAWINGS

The above and other features of the inventive concept will be more clearly understood by describing in detail exemplary embodiments thereof in conjunction with the accompanying drawings in which:

FIGS. 8A and 8B are tables showing applications of repair parity updating when a cache memory is applied to a memory system, according to an exemplary embodiment of the inventive concept;

DETAILED DESCRIPTION OF THE EMBODIMENTS

Hereinafter, exemplary embodiments of the inventive concept will be described more fully with reference to the accompanying drawings.

Figure 1:
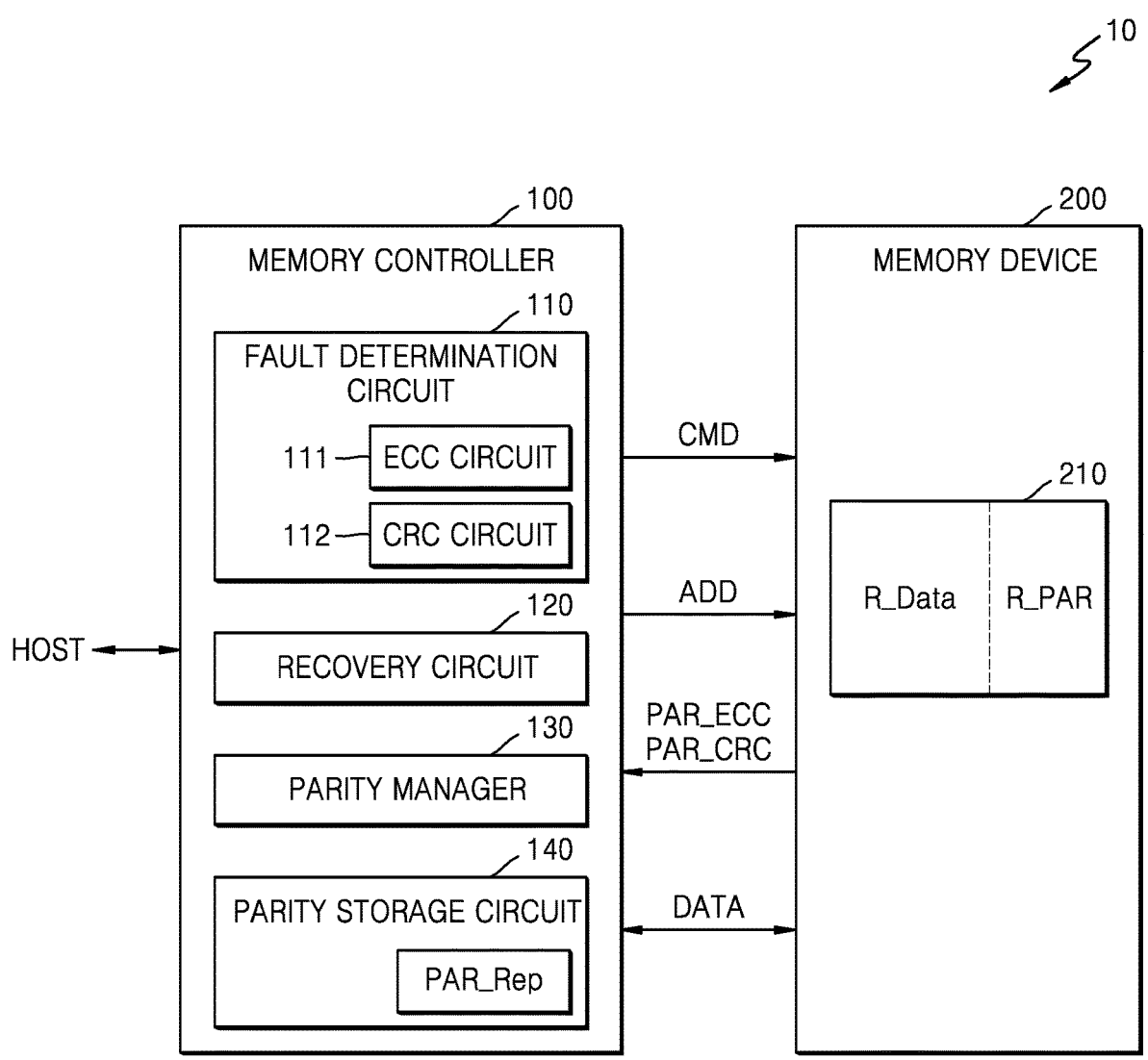
FIG. 1 is a block diagram of a memory system according to an exemplary embodiment of the inventive concept.

FIG. 1 is a block diagram of a memory system 10 according to an exemplary embodiment of the inventive concept.

Referring to FIG. 1, the memory system 10 may include a memory controller 100 and a memory device 200. The memory controller 100 provides various signals to the memory device 200 and thus controls memory operations performed by the memory device 200 such as writing and reading. For example, the memory controller 100 may provide a command CMD and an address ADD to the memory device 200 and thus access data DATA of a memory cell array 210 within the memory device 200.

The memory controller 100 may access the memory device 200 according to a request from a host HOST. The memory controller 100 may communicate with the host HOST by using various protocols. For example, the memory controller 100 may communicate with the host HOST by using an interface protocol such as Peripheral Component Interconnect—Express (PCI-E), Advanced Technology Attachment (ATA), Serial ATA (SATA), Parallel ATA (PATA), or serial attached SCSI (SAS). Various other interface protocols such as a Universal Serial Bus (USB), a Multi-Media Card (MMC), an Enhanced Small Disk Interface (ESDI) and Integrated Drive Electronics (IDE) may be applied to a protocol between the host HOST and the memory controller 100.

The memory device 200 may include various types of memory. For example, the memory device 200 may include dynamic random access memory (DRAM) such as double data rate synchronous DRAM (DDR SDRAM), low power double data rate (LPDDR) SDRAM, graphic double data rate (GDDR) SDRAM, or Rambus DRAM (RDRAM). However, exemplary embodiments of the inventive concept are not limited thereto. For example, the memory device 200 may include non-volatile memory such as flash memory, magnetic RAM (MRAM), ferroelectric RAM (FeRAM), phase change RAM (PRAM), and resistive RAM (ReRAM).

The memory device 200 may communicate with the memory controller 100 via interfaces based on various standards. For example, the memory controller 100 and the memory device 200 may perform an interface based on an LPDDR or any of various other types of standards. The memory device 200 may correspond to a single DRAM chip or a semiconductor package including a plurality of DRAM chips. Alternatively, the memory device 200 may correspond to a memory module in which a plurality of DRAM chips are mounted on a module board.

The memory controller 100 may include a fault determination circuit 110, a recovery circuit 120, a parity manager 130, and a parity storage circuit 140. The fault determination circuit 110 may include one or more error detection circuits. The parity manager 130 may include at least one circuit. Although the fault determination circuit 110 includes an error-correcting code (ECC) circuit 111 and a cyclic redundancy check (CRC) circuit 112 in FIG. 1, exemplary embodiments of the inventive concept are not limited thereto. Various types of error detection circuits may be included in the memory controller 100.

When a write request with respect to the memory device 200 is received from the host HOST, the fault determination circuit 110 may generate various types of parities from data (for example, write data DATA) and may store the various types of parities in the memory device 200. For example, the ECC circuit 111 may generate an ECC parity PAR_ECC via an operation based on a first error detection unit including the data DATA, and the CRC circuit 112 may generate a CRC parity PAR_CRC via an operation based on a second error detection unit including the data DATA. The memory device 200 may include the memory cell array 210. The memory cell array 210 may include a first region R_Data for storing normal data therein and a second region R_PAR for storing parities therein. For example, the memory controller 100 may provide the ECC parity PAR_ECC and the CRC parity PAR_CRC to the memory device 200 and the ECC parity PAR_ECC and the CRC parity PAR_CRC may be stored in the second region R_PAR. Each of the first region R_Data and the second region R_PAR may include a plurality of rows, each of which may include a plurality of memory cells.

The first error detection unit uses the ECC parity PAR_ECC and the second error detection unit uses the CRC parity PAR_CRC, and the first and second error detection units may be set variously. For example, the first error detection unit that used the ECC parity PAR_ECC may correspond to data of a first size, the second error detection unit that used the CRC parity PAR_CRC may correspond to data of a second size, and the first size and the second size may be different from each other.

For example, the first size may correspond to data of a portion of one row, and the ECC circuit 111 may generate the ECC parity PAR_ECC via an operation in which the write data DATA is used. Alternatively, when the first size corresponds to the data of one row, the memory controller 100 may generate the ECC parity PAR_ECC via an operation in which the data of the one row including the write data DATA is used.

The second size based on the CRC parity PAR_CRC may be a size corresponding to the data of a portion of one row, a size of one row, or a size corresponding to two or more rows. The first error detection unit and the second error detection unit may also be set variously. According to exemplary embodiments of the inventive concept to detect a fault from each row, the first error detection unit based on the ECC parity PAR_ECC may have a size corresponding to one row, and the second error detection unit based on the CRC parity PAR_CRC may have a size corresponding to one or more rows.

During reading of data, the data DATA and the ECC parity PAR_ECC and the CRC parity PAR_CRC corresponding thereto may be read from the memory device 200. In this case, the fault determination circuit 110 may determine whether a row (for example, a first row) from which the data DATA has been read is faulty, based on a first error detect operation using the ECC parity PAR_ECC and a second error detect operation using the CRC parity PAR_CRC. According to an exemplary embodiment of the inventive concept, the ECC parity PAR_ECC may include parity information capable of performing 1-bit error correction and 2-bit error detection, also known as single-error correcting and double-error correcting (SECDED), with respect to the data DATA, and the CRC parity PAR_CRC may include parity information capable of detecting an error of two or more bits.

According to an exemplary embodiment of the inventive concept, when an error is detected during the first error detect operation or the second error detect operation, the fault determination circuit 110 may determine that the first row from which the data DATA has been read is a faulty row. For example, in an error detection operation using the ECC parity PAR_ECC, when a 1-bit error is generated, it may be corrected and output. When a 2-bit error is detected, this may correspond to a case where an error of two or more bits is generated in the first row, and thus, it may be determined that the first row is a faulty row. Even when no errors are detected in the error detect operation using the ECC parity PAR_ECC, a case where an error is detected in an error detect operation using the CRC parity PAR_CRC may indicate that an error of two or more bits has been generated in an error detection unit including one or more rows. In this case, it may be determined that the first row is a faulty row.

According to another exemplary embodiment of the inventive concept, regardless of a result of error detection using the ECC parity PAR_ECC, when an error is detected in the second error detect operation using the CRC parity PAR_CRC, the fault determination circuit 110 may determine that the first row is a faulty row. For example, in the error detect operation using the ECC parity PAR_ECC, a system may be configured such that an error of a single bit may be corrected, and separately an error detect operation using the CRC parity PAR_CRC may be performed to determine the existence or absence of a fault in units of rows. In other words, even when no errors are detected in the first error detect operation using the ECC parity PAR_ECC, when an error is detected in the second error detect operation using the CRC parity PAR_CRC, it is determined that the first row is a faulty row.

In addition, according to various exemplary embodiments of the inventive concept, the presence or absence of a fault may be determined in units of rows. According to an exemplary embodiment of the inventive concept, when errors are detected in both the first error detect operation using the ECC parity PAR_ECC and the second error detect operation using the CRC parity PAR_CRC, the fault determination circuit 110 may determine that the first row is a faulty row.

A determination as to whether the first row is faulty may be made according to various methods as described above, and the recovery circuit 120 may repair the data of the first row. According to an exemplary embodiment of the inventive concept, the parity manager 130 may manage generation and storage of a parity (for example, a repair parity PAR_Rep) that is used to repair the data of a faulty row, and the parity manager 130 may store the repair parity PAR_Rep in the parity storage circuit 140. With regard to a repair unit (e.g., the unit in which repairing is performed) having a size corresponding to a plurality of rows including the first row, the parity manager 130 may control and manage an update operation with respect to the repair parity PAR_Rep during writing and reading of data.

When the first row is determined to be a faulty row, the recovery circuit 120 may perform a recovery algorithm using the data of other rows constituting a single repair unit (for example, second rows) together with the first row, and the repair parity PAR_Rep stored in the parity storage circuit 140, and may repair the data of the first row determined to be a faulty row through the recovery algorithm. In other words, the recovery circuit 120 may repair data of the faulty first row by using data of at least another row and the repair parity PAR_Rep. For example, when the data of the plurality of rows including the first row and the repair parity PAR_Rep constitute a single repair unit and the first row from among the rows included in the repair unit is a faulty row, a recovery algorithm using the data of the remaining rows and the repair parity PAR_Rep may be performed, and thus, the data of the faulty row may be repaired.

According to an exemplary embodiment of the inventive concept as described above, even when a faulty row is generated within the memory device 200 that may be configured of a single chip, a determination as to whether a row is faulty may be accurately made through one or more error detection processes. In this case, the data of the faulty row may be repaired through the above-described recovery algorithm using the repair parity PAR_Rep. Thus, even when the number of errors increases and a fault is generated in units of rows due to various causes such as process shrinkage within a single chip, the data of a faulty row may be repaired based on faulty row determination and a recovery algorithm according to exemplary embodiments of the inventive concept.

According to an exemplary embodiment of the inventive concept, the first error detect operation using the ECC parity PAR_ECC and the second error detect operation using the CRC parity PAR_CRC may be performed together during reading of the data DATA, and a determination as to whether a row is faulty may be finally made through various combinations of a first error detection result and a second error detection result. Thus, it can be more accurately determined whether a row is faulty.

In other words, according to an exemplary embodiment of the inventive concept, the memory device 200 implemented using a single DRAM chip may repair a fault of each row in addition to performing SECDED regarding error correction, and thus, data reliability can increase.

Figure 2:
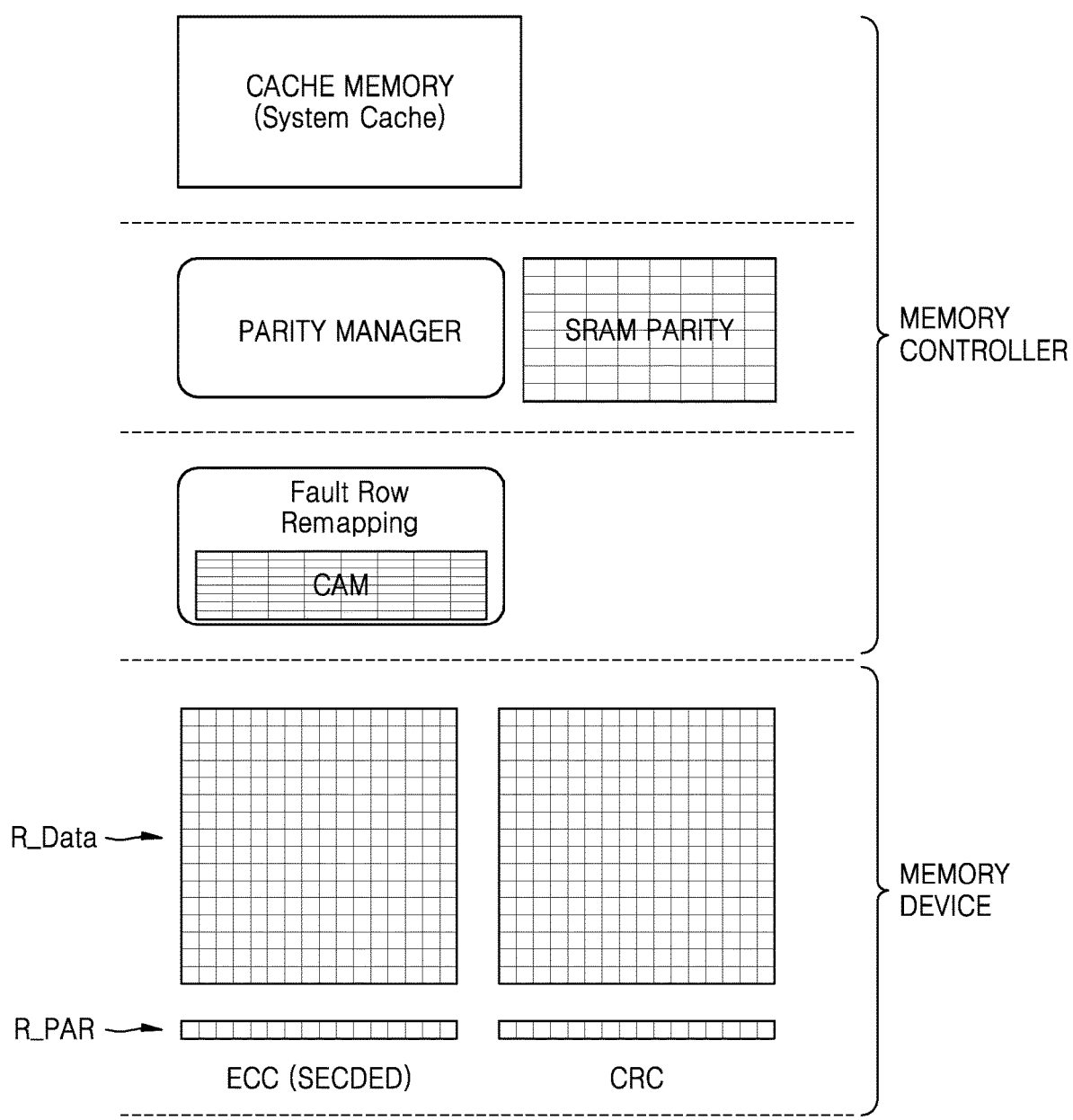
FIG. 2 is a block diagram of an implementation of a memory system according to an exemplary embodiment of the inventive concept.

FIG. 2 is a block diagram of an implementation of a memory system according to an exemplary embodiment of the inventive concept. FIG. 2 illustrates the hierarchy of a memory system including a memory device and a memory controller. For convenience of explanation, FIG. 2 illustrates only some components that may be included in the memory system. However, other components related to a memory operation may be further included in the memory system.

Referring to FIG. 2, the memory system may include the memory controller and the memory device, the memory device may include a memory cell array according to the above-described embodiment, and the memory cell array may include a first region R_Data for storing normal data therein and a second region R_PAR for storing various types of parities therein. For example, the ECC parity PAR_ECC and the CRC parity PAR_CRC may be stored in the second region R_PAR.

The first region R_Data for storing normal data may include a plurality of rows, and, as described above, an error detection unit using the ECC parity PAR_ECC (e.g., the unit in which an error is detected using the ECC parity PAR_ECC) and an error detection unit using the CRC parity PAR_CRC (e.g., the unit in which an error is detected using the CRC parity PAR_CRC) may be variously set. For example, the error detection unit using the ECC parity PAR_ECC may have a size corresponding to a single row, and the error detection unit using the CRC parity PAR_CRC may have a size corresponding to one or more (or two or more) rows. For example, to determine presence or absence of a fault in units of rows according to exemplary embodiments of the inventive concept, the size of an error detection unit based on the unit of rows may be set. Although respective locations where the ECC parity PAR_ECC and the CRC parity PAR_CRC are stored are distinguished from each other in the example of FIG. 2, the ECC parity PAR_ECC and the CRC parity PAR_CRC may be stored in the same row or in different rows, or may be stored in the same bank or in different banks.

In FIG. 2, the memory controller includes a parity manager and a parity storage circuit, and the parity storage circuit is implemented using, for example, SRAM having a size of 512 KB. The parity storage circuit is shown as SRAM parity in FIG. 2. According to the above-described embodiment, the parity manager may generate a repair parity in correspondence to a single repair unit including a plurality of rows, and store the repair parity in the SRAM. The repair unit may have various sizes. For example, 16K rows may be a single repair unit, and the single repair parity may have a value based on the data of the 16K rows. The memory controller (or a recovery circuit) may perform a recovery algorithm with respect to a faulty row according to a similar method to a Redundant Array of Inexpensive Disk (RAID). In the SRAM, repair parities for a plurality of repair units may be stored.

According to an exemplary embodiment of the inventive concept, the memory controller may perform a repair operation with respect to a faulty row and may store repaired data in another row within the memory device. The memory device may further include a spare region including one or more rows, and the data of a row corresponding to a faulty row may be repaired and stored in a row of the spare region.

For example, when data is read from the first row in response to a read request with respect to the first row indicated by a first address from a host and the first row is a faulty row, a recovery algorithm for the first row may be performed according to the above-described embodiments, and repaired data may be stored in a second row indicated by a second address of the memory device. In this case, the memory controller may include a faulty row remapping circuit, and the faulty row remapping circuit may include a content addressable memory (CAM). Transform information between the first address and the second address may be stored in the CAM, and, when an access request for the first row is received from the host later, the faulty row remapping circuit may transform the first address to the second address and may provide, to the host, data accordingly accessed from the second row of the memory device.

The memory controller may further include cache memory, and the cache memory may include a memory (for example, SRAM) having a size of several MB. According to an exemplary embodiment of the inventive concept, when data read and write operations are performed with respect to one of a plurality of rows included in one repair unit, write data and read data may be loaded on the cache memory, and the data loaded on the cache memory may be transmitted to the memory device or may be provided to the host. When the data is loaded on the cache memory, the value of a repair parity corresponding to the data is to be updated, and thus, the parity manager may perform an update operation with respect to the repair parity, based on at least one of new data (for example, write data), old data (for example, read data), a pre-stored repair parity, and the data of another row of the one repair unit.

Although the cache memory is included in the memory controller in FIG. 2, exemplary embodiments of the inventive concept are not limited thereto. For example, a system cache may be applied to a data processing system including a memory controller and a memory device, and the system cache may be disposed outside the memory controller. For example, when there is a data write request from a host, write data may be temporarily stored in the system cache, and the memory controller may read data from the system cache and may provide the read-out data to the memory device. Alternatively, data of a certain size from among the pieces of data stored in the memory device is pre-loaded on the system cache, and, according to a cache hit or a cache miss when there is a data read request from the host, the data stored in the system cache may be provided to the host or the data read from the memory device may be provided to the host.

Figure 3:
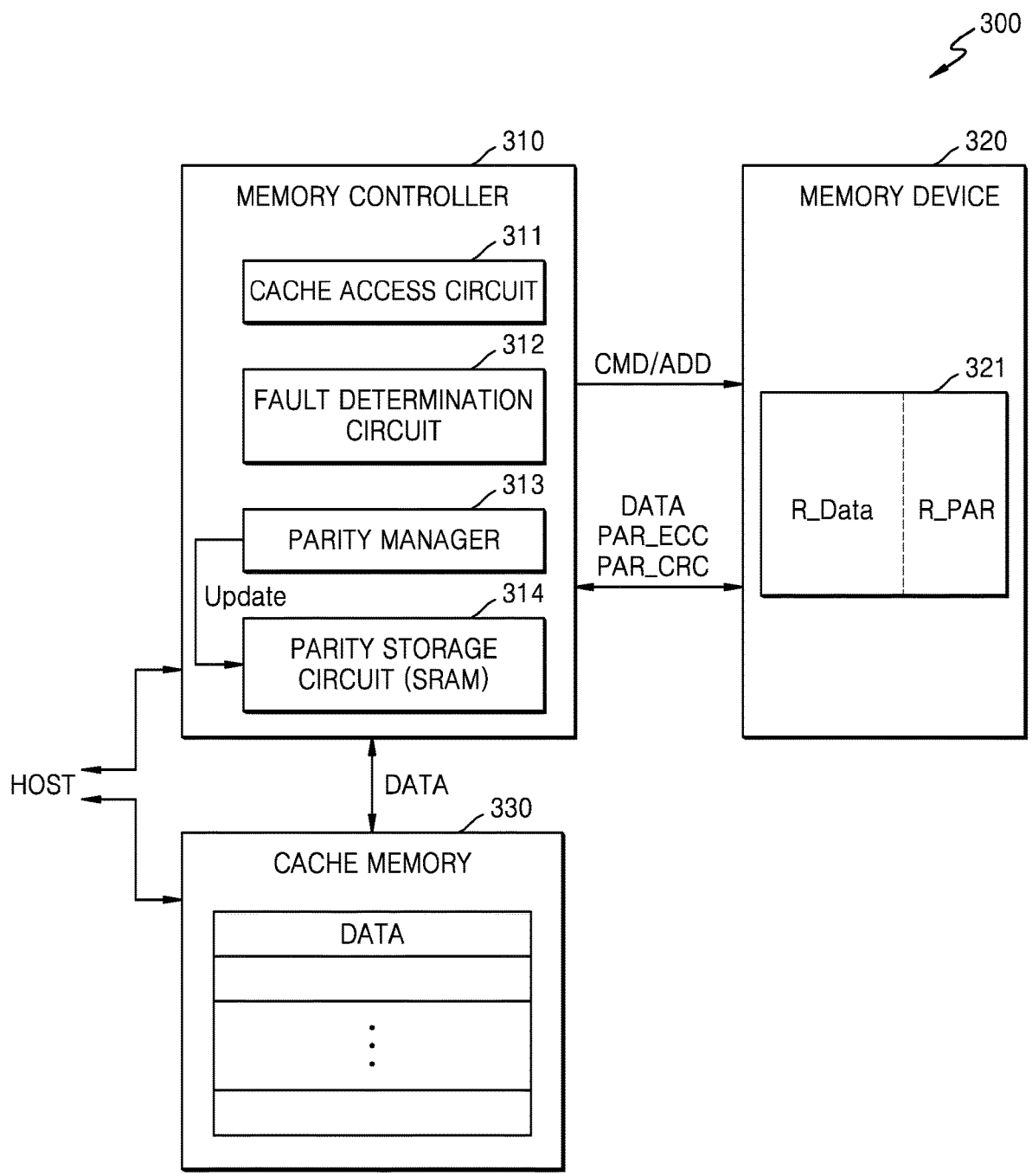
FIG. 3 is a block diagram of a memory system according to another exemplary embodiment of the inventive concept.

FIG. 3 is a block diagram of a memory system 300 according to another exemplary embodiment of the inventive concept. FIG. 3 illustrates data storage and repair parity updating when a memory system includes a cache memory.

Referring to FIG. 3, the memory system 300 may include a memory controller 310, a memory device 320, and a cache memory 330. Although the cache memory 330 is included outside the memory controller 310 in FIG. 3, the memory system 300 may be implemented such that the cache memory 330 is located within the memory controller 310.

The memory controller 310 may include a cache access circuit 311, a fault determination circuit 312, a parity manager 313, and a parity storage circuit 314. Various other types of components may be further included in the memory controller 310. For example, a recovery circuit like in the above-described embodiment may be further included in the memory controller 310. The parity storage circuit 314 may include an SRAM as any of various types of volatile memories. The memory controller 310 may provide a command/address CMD/ADD to the memory device 320, and may transmit or receive data DATA and parity information (PAR_ECC and PAR_CRC) to or from the memory device 320. A memory cell array 321 of the memory device 320 may include a first region R_Data for storing the data DATA, and a second region R_PAR for storing ECC/CRC parity.

The cache access circuit 311 may control data movement via the cache memory 330. For example, data read from the memory device 320 may be stored in the cache memory 330, and the read-out data stored in the cache memory 330 may be provided to a host HOST. In other words, in a data read operation, an actual read operation is not performed on the read-out data stored in the memory device 320, since the read-out data stored in the cache memory 330 may be provided to the host according to a cache hit. Write data may be temporarily stored in the cache memory 330 in a data write operation, and the memory controller 310 may control an evict operation of providing the write data stored in the cache memory 330 to the memory device 320.

According to an exemplary embodiment of the inventive concept, while data is moving using the cache memory 330, an update operation with respect to a repair parity corresponding to a repair unit including the data DATA may be managed. For example, write data that is newly written to a first row of the memory cell array 321 may be temporarily stored in the cache memory 330, and then, the write data stored in the cache memory 330 may be provided to the first row. At this time, the parity manager 313 may calculate the value of the repair parity in an operation in which the write data is stored in the cache memory 330 or an operation in which the write data is provided to the first row, and may update the calculated value of the repair parity in the parity storage circuit 314. This update is shown in FIG. 3 which shows the calculated value of the repair parity being provided from the parity manager 313 to the parity storage circuit 314. Alternatively, in a data reading process, data is read from the first row of the memory cell array 321 and stored in the cache memory 330. In this case, the first row may be removed from the rows constituting a repair unit (or may be invalidated), the value of a repair parity corresponding to the repair unit may be changed during the invalidation process, and the changed value of the repair parity may be updated in the parity storage circuit 314.

According to an exemplary embodiment of the inventive concept, by providing the cache memory 330 to the memory system 300, an access frequency with respect to the data DATA of the memory cell array 321 may be reduced, and an operation of updating the parities (e.g., ECC parity and CRC parity) stored in the memory cell array 321 may be minimized. Accordingly, the performance of the memory system 300 may be improved, and the second region R_PAR of the memory cell array 321 for storing parities may be prevented from being quickly worn out.

Figure 4:
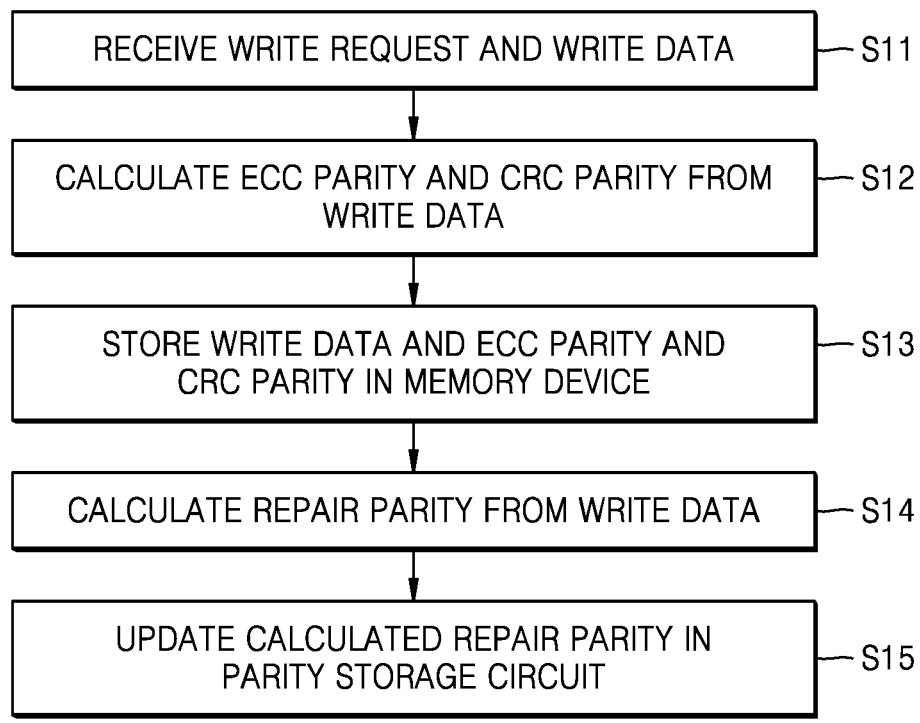
FIGS. 4 and 5 are flowcharts of operation methods of a memory controller, according to exemplary embodiments of the inventive concept.
Figure 5:
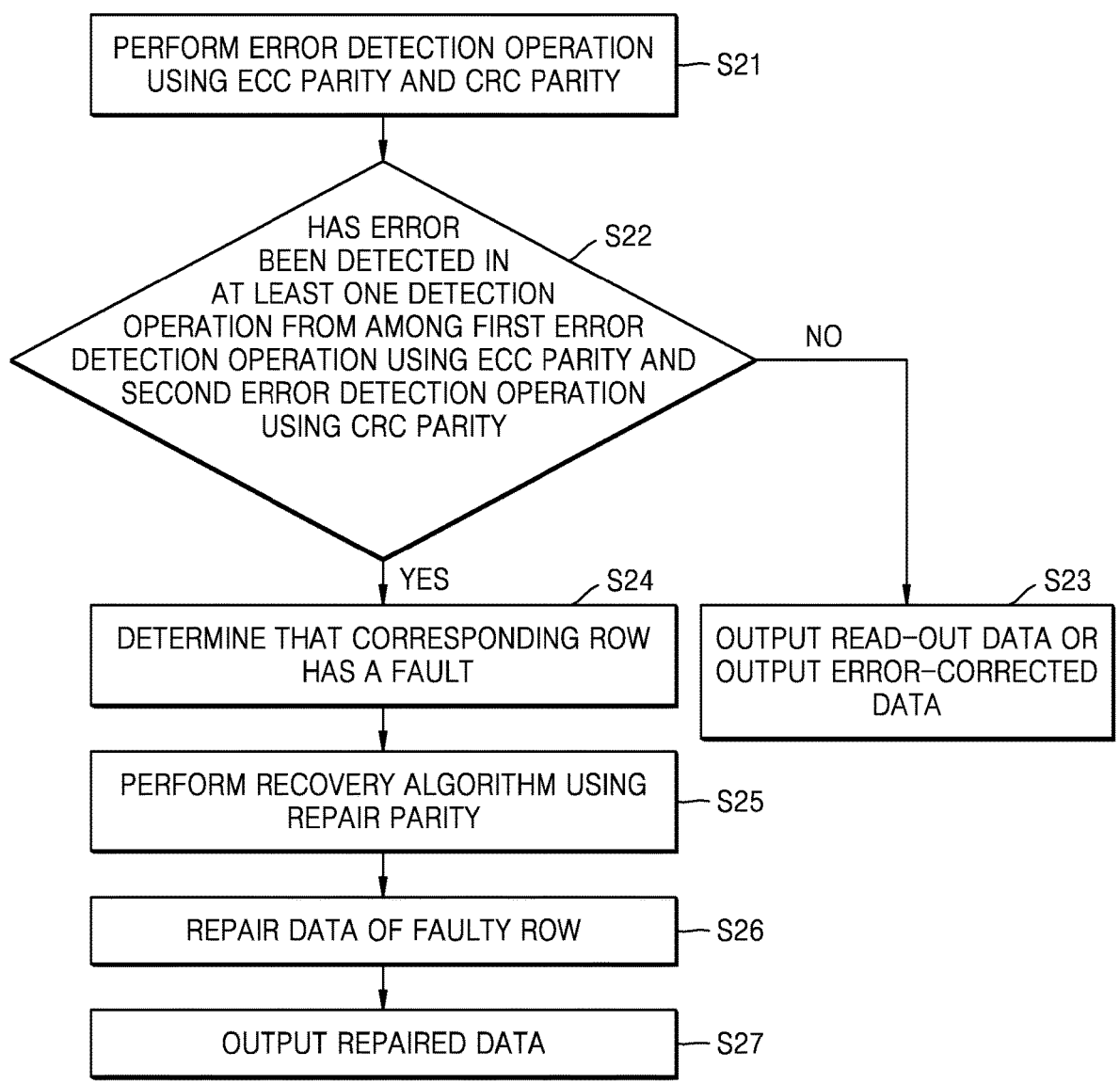

FIGS. 4 and 5 are flowcharts of operation methods of a memory controller, according to exemplary embodiments of the inventive concept. FIG. 4 illustrates a data write operation, and FIG. 5 illustrates a data read operation.

Referring to FIG. 4, the memory controller may control a memory operation with respect to a memory device, for example, a write operation with respect to a first row of a memory cell array included in the memory device. According to the above-described embodiments, various types of error detection techniques are applicable to a memory system. For example, an error detect operation based on an ECC parity and a CRC parity is applicable to the memory system. The size of a first error detection unit using the ECC parity and the size of a second error detection unit using the CRC parity may be variously set.

In operation S11, a write request for a first row may be received from a host and write data may be received by the memory controller. In operation S12, an ECC circuit and a CRC circuit included in the memory controller may calculate an ECC parity and a CRC parity, respectively, from the write data. For example, when the first error detection unit has a size corresponding to one row and the second error detection unit has a size corresponding at least two rows, the ECC circuit may calculate an ECC parity from the data of one row unit including the write data, and the CRC circuit may calculate a CRC parity by using the data of one or more other rows that constitute the second error detection unit together with the data of one row including the write data. In operation S13, the write data and the ECC parity and the CRC parity may be stored in the memory device.

The memory controller may generate a repair parity that is used in a recovery algorithm to repair the data of a faulty row. In operation S14, the repair parity may be calculated based on the value of data that is newly written. In operation S15, the calculated repair parity may be updated in a parity storage circuit within the memory controller. Thereafter, when a fault is generated in units of rows in a plurality of rows included in the repair unit, a recovery algorithm may be performed using the repair parity updated in the parity storage circuit, and accordingly the data of a faulty row may be repaired.

Referring to FIG. 5, as a read operation with respect to the data of the first row is requested by the host, the memory controller may read the data of the first row and the ECC parity and the CRC parity corresponding to the data of the first row, and may perform an error detection operation using the ECC parity and the CRC parity, in operation S21. In operation S22, it may be determined whether an error has been detected in at least one of a first error detect operation using the ECC parity and a second error detect operation using the CRC parity. When no errors are detected in the first error detect operation and the second error detect operation or only a correctable error is generated, read-out data may be output to the host or error-corrected data may be output to the host, in operation S23.

A determination as to whether a row has a fault may be made using various methods according to the above-described embodiments. When an error is detected in at least one detect operation from among the first error detect operation and the second error detect operation, it may be determined that a corresponding row (for example, the first row) has a fault, in operation S24. For example, when a 2-bit error is detected in the first error detect operation using the ECC parity or an error is detected in the second error detect operation using the CRC parity, the first row may be determined to be a faulty row. Alternatively, according to various embodiments of the inventive concept, when errors are detected in both the first error detect operation and the second error detect operation, the first row may be determined to be a faulty row.

In operation S25, when the first row is determined to be a faulty row, the recovery circuit within the memory controller may perform a recovery algorithm using the data of the rows included in a repair unit and a repair parity. For example, the data of the rows included in a repair unit may include the data of the first row and the data of a second row, and this data is used in conjunction with the repair parity by the recovery circuit to generate repair data. In operation S26, as the recovery algorithm is performed, the data of the first row corresponding to the faulty row may be repaired. In operation S27, repaired data may be output to the host. According to exemplary embodiments of the inventive concept, the repaired data of the first row may be stored in a cache memory included in the memory system, and, when data reading with respect to the first row is requested later by the host, previously-repaired data stored in the cache memory may be output to the host without having to perform an error detection and a recovery algorithm. The repaired data of the first row may be provided to the memory device, and the repaired data may be re-written to the first row of the memory cell array or may be written to a spare region of the memory device.

Figure 6:
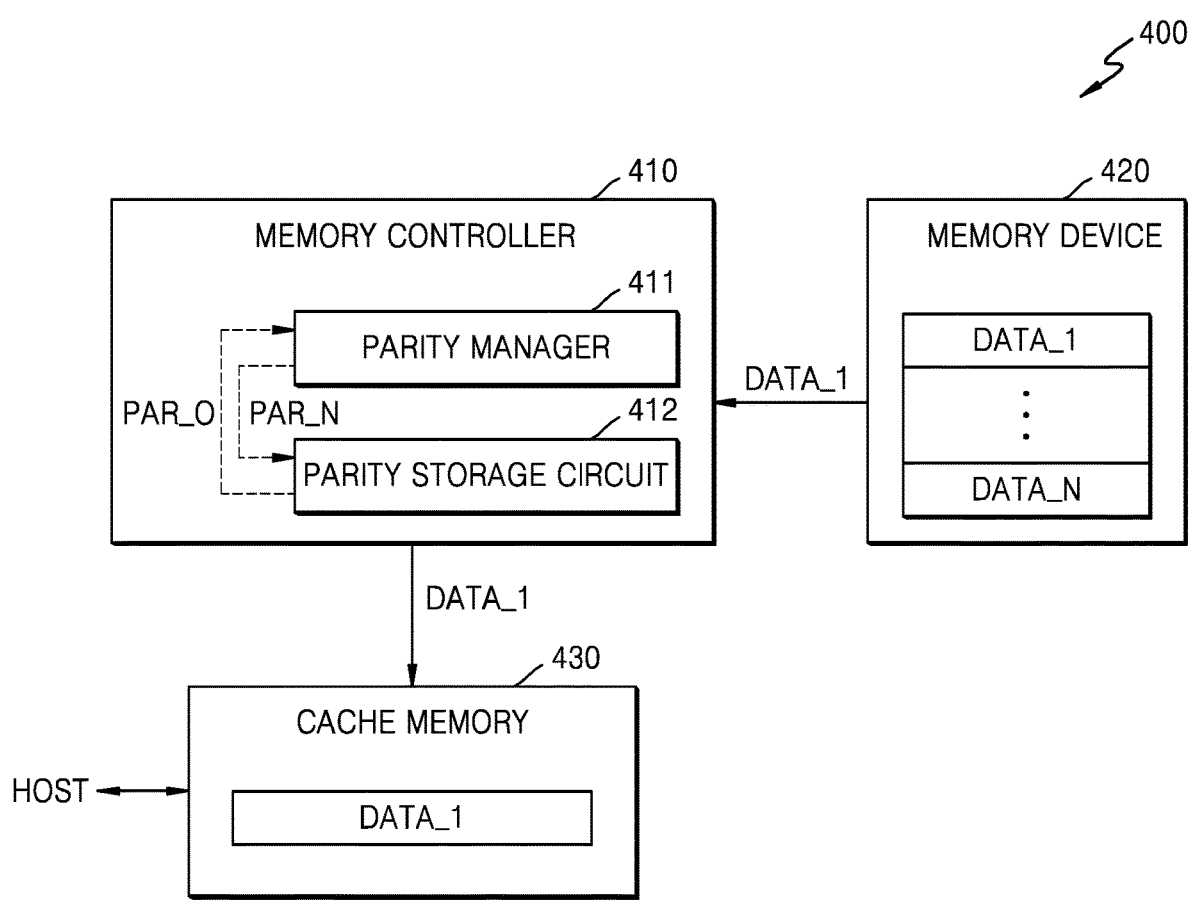
FIGS. 6 and 7 are block diagrams illustrating data loading on a cache memory and a repair parity update operation corresponding to the data loading according to exemplary embodiments of the inventive concept.
Figure 7:
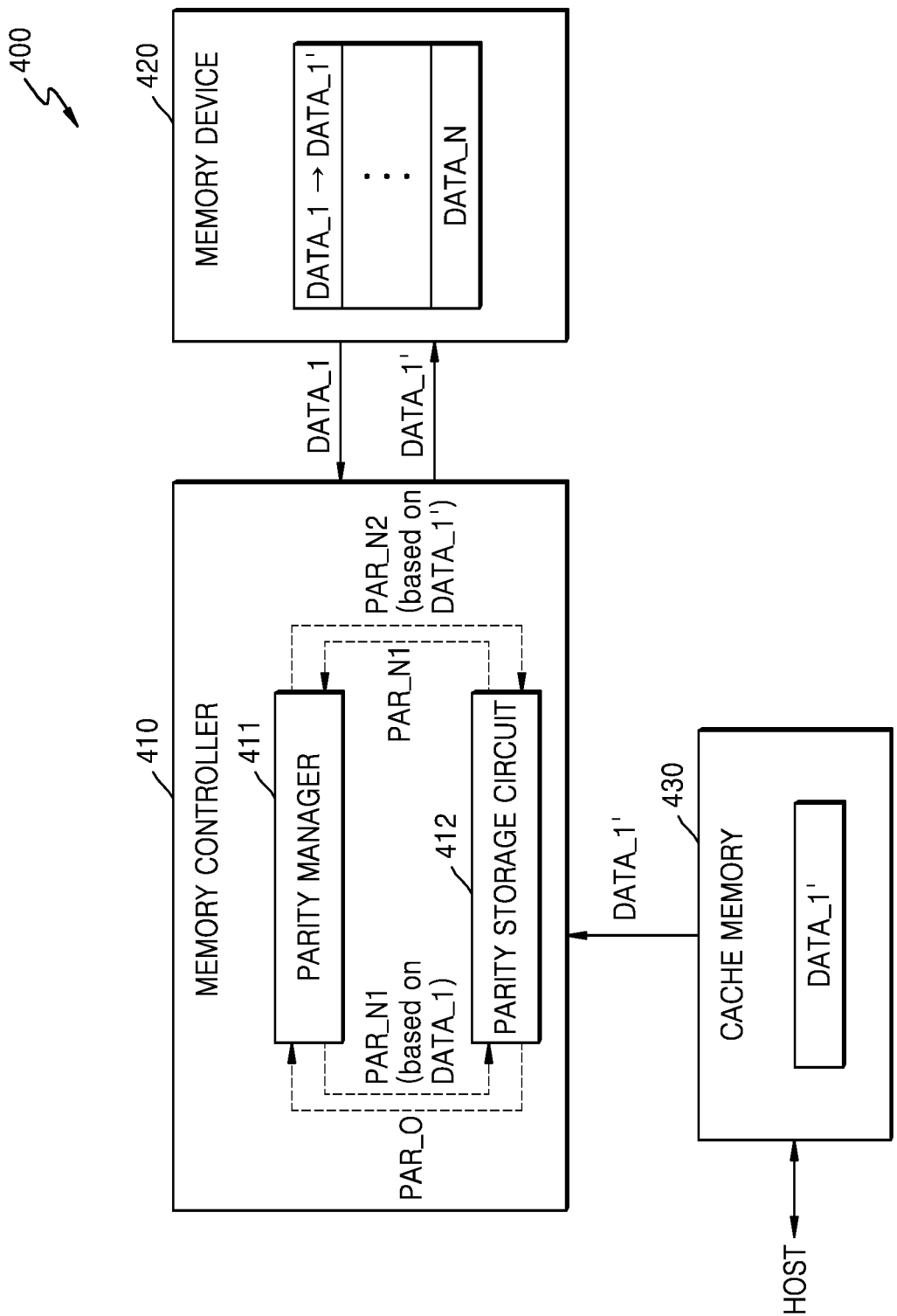

FIGS. 6 and 7 are block diagrams illustrating data loading on a cache memory and a repair parity updating operation corresponding to the data loading. FIG. 6 illustrates a repair parity updating operation during data reading according to an exemplary embodiment of the inventive concept, and FIG. 7 illustrates a repair parity updating operation during data writing according to an exemplary embodiment of the inventive concept. FIGS. 6 and 7 illustrate arrangement of a cache memory outside a memory controller. However, as in the above-described embodiment, the cache memory may be included in the memory controller.

Referring to FIG. 6, a memory system 400 may include a memory controller 410, a memory device 420, and a cache memory 430. The memory controller 410 may include a parity manager 411 and a parity storage circuit 412, and the memory device 420 may include a memory cell array that stores first through N-th data DATA_1 through DATA_N. The first through N-th data DATA_1 through DATA_N may be stored in first through N-th rows that constitute a single repairing unit.

As reading of the data stored in the first row is requested by the host HOST, it may be determined whether data of the first row (first data DATA._) pre-exists in the cache memory 430. For example, in the case of a cache hit (i.e., the first data DATA_1 is present in the cache memory 430), the first data DATA_1 of the cache memory 430 may be provided to the host HOST without a having to perform an update operation with respect to a repair parity. When the first data DATA_1 does not exist in the cache memory 430 (e.g., there is a cache miss), the memory controller 410 may read the first data DATA_1 from the memory device 420, store the read-out first data DATA_1 in the cache memory 430, and provide the first data DATA_1 from the cache memory 430 to the host HOST. According to an exemplary embodiment of the inventive concept, an error detect operation may be performed using an ECC parity and a CRC parity for the first data DATA_1 read from the memory device 420, and, when the first row is determined to be a faulty row, a recovery algorithm may be performed according to the above-described embodiments, and error-repaired first data DATA_1 may be stored in the cache memory 430. In other words, erroneous data is corrected by the memory controller 410 before providing the data to the host HOST.

An existing repair parity (for example, an old parity PAR_O) corresponding to the repair unit including the first through N-th data DATA_1 through DATA_N may exist in the parity storage circuit 412. While the first data DATA_1 is being read from the memory device 420 and stored in the cache memory 430, the old parity PAR_O may be changed to a new parity PAR_N, and the new parity PAR_N may be updated in the parity storage circuit 412. This parity change may be performed by the parity manager 411. Thus, when the first data DATA_1 is stored in the cache memory 430 and reading of the first data DATA_1 is requested later, the first data DATA_1 stored in the cache memory 430 may be provided to the host HOST without having to perform a read operation with respect to the memory device 420 and a recovery algorithm. Accordingly, the first data DATA_1 of the first row may be removed from the repair unit, and thus, the existing old parity PAR_O may be changed to the new parity PAR_N.

In an operation of updating a repair parity, the new parity PAR_N may be generated via an operation (for example, an XOR operation) between the first data DATA_read out from the memory device 420 and the old parity PAR_O, and the new parity PAR_N may be updated in the parity storage circuit 412. The new parity PAR_N may have information for repairing the data of a faulty row of the second through N-th data DATA_2 through DATA_N in an existing repair unit.

FIG. 7 illustrates a repair parity updating process in a data write operation.

Referring to FIG. 7, when storage of write data in a first row is requested by the host HOST, write data DATA_1' to be written to the first row may be temporarily stored in the cache memory 430.

At this time, to update information about a repair parity corresponding to a repair unit including the first row, the memory controller 410 may read the data previously stored in the first row (for example, the first data DATA_1), and a new first parity PAR_N1 may be calculated via an operation (for example, an XOR operation) using the existing repair parity (for example, the old parity PAR_O) corresponding to the repair unit and the first data DATA_1. The new first parity PAR_N1 may be updated in the parity storage circuit 412, the first row or the first data DATA_1 may be removed from the repair unit, and the new first parity PAR_N1 may have information for repairing the data of a faulty row of the remaining second through N-th data DATA_2 through DATA_N of the repair unit.

A repair parity updating operation may be performed again in a process where the write data DATA_1' is provided to the memory device 420 and written to the first row. For example, the new first parity PAR_N1 stored in the parity storage circuit 412 may be provided to the parity manager 411, the parity manager 411 may calculate a new second parity PAR_N2 via an operation (for example, an XOR operation) using the write data DATA_1' and the new first parity PAR_N1, and the calculated new second parity PAR_N2 may be updated in the parity storage circuit 412. The write data DATA_1' may be written to the first row of the memory device 420, and the new second parity PAR_N2 may have information for repairing the data of a faulty row of a repair unit including the write data DATA_1'.

According to the above-described embodiments, the memory system 400 including the cache memory 430 may selectively perform a repair parity update operation according to a cache hit or cache miss during a data read operation. While write data is moving via the cache memory 430 in a data write operation, a repair parity update operation may be selectively performed. In other words, a repair parity update operation may be efficiently performed in the memory system 400 including the cache memory 430, and thus, an amount of time taken to perform an operation to update a repair parity may be reduced or a memory storing the repairing parity may be prevented from being quickly worn out.

The embodiment of FIGS. 6 and 7 illustrates an implementable repair parity update policy according to the inventive concept; however, a repair parity update operation may be performed in various other ways. For example, a new repair parity may be calculated at various timings where data is moved using a cache memory, and an operation of updating the calculated repair parity may be performed.

FIGS. 8A and 8B are tables showing applications of repair parity updating when a cache memory is applied to a memory system. According to exemplary embodiments of the inventive concept, a repair parity update operation may be variously set. Although FIGS. 8A and 8B illustrate embodiments corresponding to separate update policies, the inventive concept are not limited thereto, and various modifications may be made thereto.

Referring to FIG. 8A, it is illustrated whether a memory system to which a cache memory has been applied updates a repair parity in data read and write processes. For example, according to a cache hit or cache miss in a data read process, data may be read from the cache memory or data may be read from a memory device. When data is read from the memory device (or the first row of the memory cell array), the first row may be removed from the repair unit and thus a repair parity updating operation may be performed. On the other hand, when data is read from the cache memory, a repair parity updating operation may be omitted.

In a data write process with respect to the first row, when data is written to the first row of the memory device, a data value of the first row of the memory device may vary, and accordingly a repair parity updating operation may be performed. In a process where data to be written to the first row is temporarily stored in the cache memory, the following update policy is applicable. For example, when existing data of the first row exists as a valid entry in the cache memory, the first row may correspond to a state of being removed from the repair unit and the repair parity may have a value irrelevant to the data of the first row of the memory device. Accordingly, in a process where the data to be written to the first row is temporarily stored in the cache memory, a repair parity updating operation may be omitted. In other words, when the data of the first row is valid, a repair parity updating operation is not performed. On the other hand, when existing data of the first row does not exist as a valid entry in the cache memory, the existing data may be read from the first row, and the first row may be removed from the repair unit and at the same time a repair parity updating operation may be performed. A repair parity updating operation may be performed again in an evict process where the data to be written is provided to the first row of the memory device.

FIG. 8B illustrates another policy of a repair parity updating operation. FIG. 8B illustrates an example where a repair parity updating operation is omitted while write data is being temporarily stored in the cache memory in a data write process.

Referring to FIG. 8B, similar to that described for FIG. 8A, when data is written to or read from the memory device in a data read and write operation, a repair parity updating operation may be performed. On the other hand, when data is read from the cache memory in the data read process or data is temporarily stored in the cache memory in the data write process, a repair parity updating operation may be omitted.

In an evict process in which data to be written to the first row is provided from the cache memory to the memory device, the following policy is applicable in relation to the updating of a repair parity. For example, existing data (for example, old data) may be read from the first row before data is written to the first row, the value of a repair parity may be changed via an operation using the read-out old data and an existing repair parity, and the changed value of the repair parity may be updated. The value of a repair parity may be changed again via an operation using new data and a previously-calculated new repair parity, and the changed value of the repair parity may be updated again.

Figure 9:
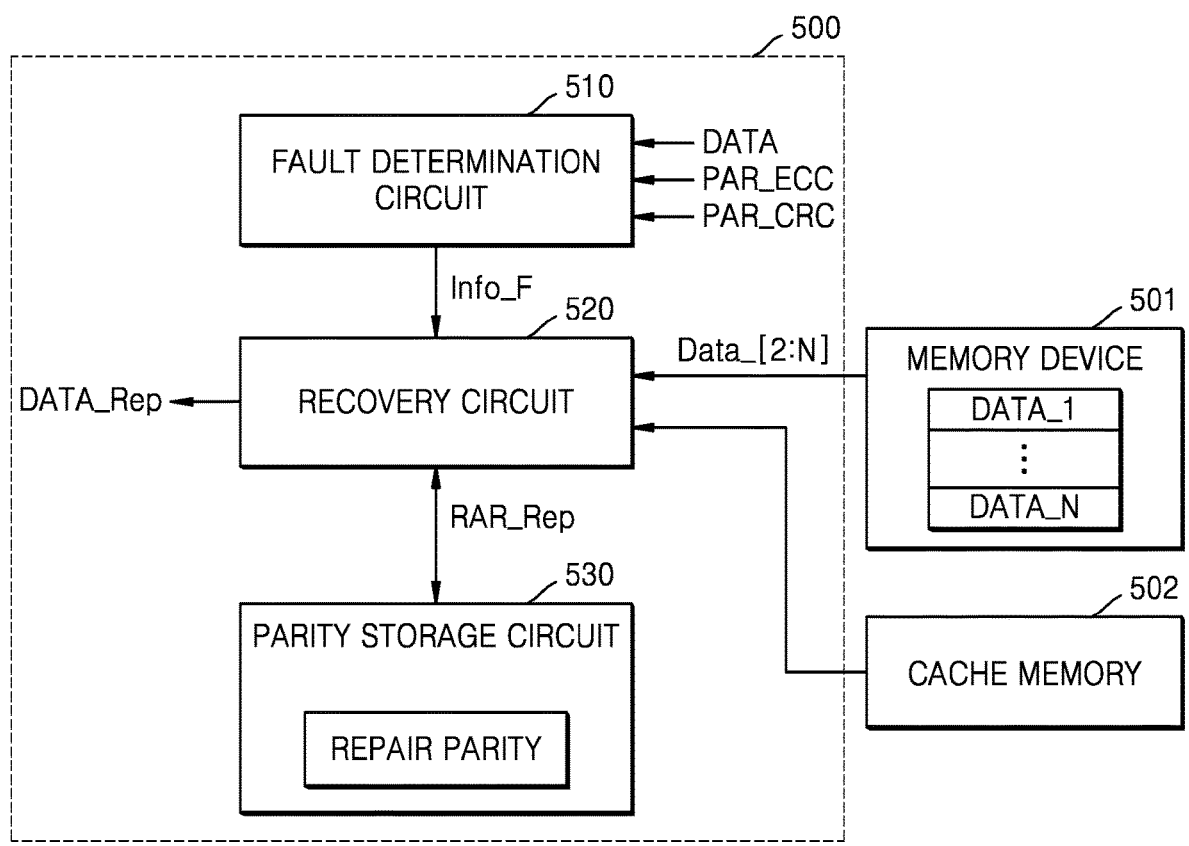
FIG. 9 is a block diagram illustrating an operation of repairing the data of a faulty row by performing a recovery algorithm, according to an exemplary embodiment of the inventive concept.

FIG. 9 is a block diagram illustrating an operation of repairing the data of a faulty row by performing a recovery algorithm, according to an exemplary embodiment of the inventive concept.

Referring to FIG. 9, a memory controller 500 may include a fault determination circuit 510, a recovery circuit 520, and a parity storage circuit 530, and the memory controller 500 may communicate with a memory device 501 and a cache memory 502. The cache memory 502 may be arranged outside the memory controller 500. Components included in the memory controller 500 that correspond to those of the above-described embodiments, will not be described in detail with reference to FIG. 9.

In a data read process, the fault determination circuit 510 may receive an ECC parity PAR_ECC and a CRC parity PAR_CRC and read data DATA, may determine, via an error detect operation according to the above-described embodiments, whether a first row storing the read data DATA is faulty, and may output a determination result Info_F corresponding to a result of the determination. In other words, an error detect operation may be performed using the ECC parity PAR_ECC and the CRC parity PAR_CRC, the determination as to whether the first row is faulty may be made according to a faulty row determination policy that may be set variously, and the recovery circuit 520 may perform a recovery algorithm, based on the determination result Info_F.

The memory controller 500 may control a memory operation for receiving the data of other rows that constitute a repair unit together with the first row. For example, data DATA_[2:N] of second through N-th rows that constitute a repair unit together with the first row may be provided from the memory device 501 or the cache memory 502 to the recovery circuit 520, and a repair parity PAR_Rep stored in the parity storage circuit 530 may be provided to the recovery circuit 520. The recovery circuit 520 may repair the data of the first row via a recovery algorithm using the data DATA_[2:N] of the second through N-th rows and the repair parity PAR_Rep, and may output repaired data DATA_Rep.

Figure 10:
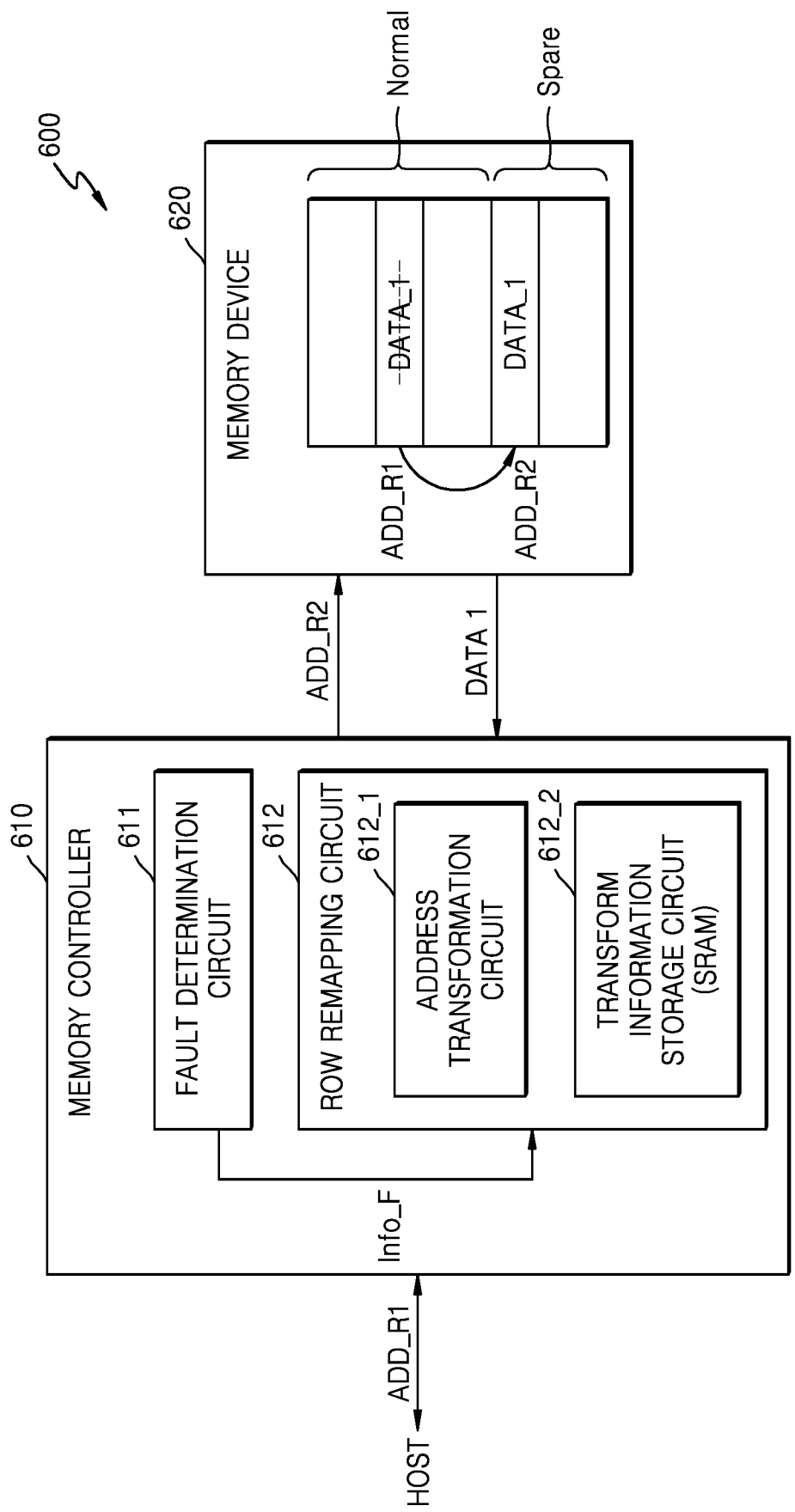
FIG. 10 is a block diagram illustrating a memory controller for performing a remapping operation with respect to a faulty row, and a memory system including the memory controller, according to an exemplary embodiment of the inventive concept.

FIG. 10 is a block diagram illustrating a memory controller 610 for performing a remapping operation with respect to a faulty row, and a memory system 600 including the memory controller 610. In FIG. 10, for convenience of explanation, a cache memory is omitted. However, according to the above-described embodiments, a cache memory may be further included in the memory system 600.

Referring to FIG. 10, the memory system 600 may include the memory controller 610 and a memory device 620, and the memory controller 610 may include a fault determination circuit 611 and a row remapping circuit 612. The row remapping circuit 612 may include an address transformation circuit 612_1 and a transform information storage circuit 6122, and the transform information storage circuit 612_2 may include various types of memory. For example, the transform information storage circuit 612_2 may include an SRAM. The transform information storage circuit 612_2 may correspond to a CAM. Although FIG. 10 illustrates an example where the SRAM, which is a volatile memory, is included in the transform information storage circuit 612_2, the inventive concept is not limited thereto, and various types of memory are applicable to the transform information storage circuit 612_2.

The fault determination circuit 611 may determine whether rows are faulty, according to the above-described embodiments, and may provide the determination result Info_F to the row remapping circuit 612. The memory controller 610 may include a recovery circuit and a parity storage circuit, and, when it is determined that a row (for example, the first row) indicated by a first address ADD_R1 is faulty, the recovery circuit may repair the first data DATA_1 stored in the first row by performing a recovery algorithm using a repair parity stored in the parity storage circuit.

The memory device 620 may include a memory cell array including a plurality of rows, and also include a spare region including one or more rows for replacing a faulty row existing in the memory cell array. The row remapping circuit 612 may transform the first address ADD_R1 indicating the first row corresponding to a faulty row into a second address ADD_R2 indicating a row (for example, a second row) located in the spare region. Address transformation information may be stored in the transform information storage circuit 612_2. Thereafter, when a data read request and the first address ADD_R1 are provided from the host HOST, the memory controller 610 may transform the first address ADD_R1 into the second address ADD_R2 and output the second address ADD_R2, and the first data DATA_1 read from the second row of the spare region may be provided to the host HOST.

Figure 11:
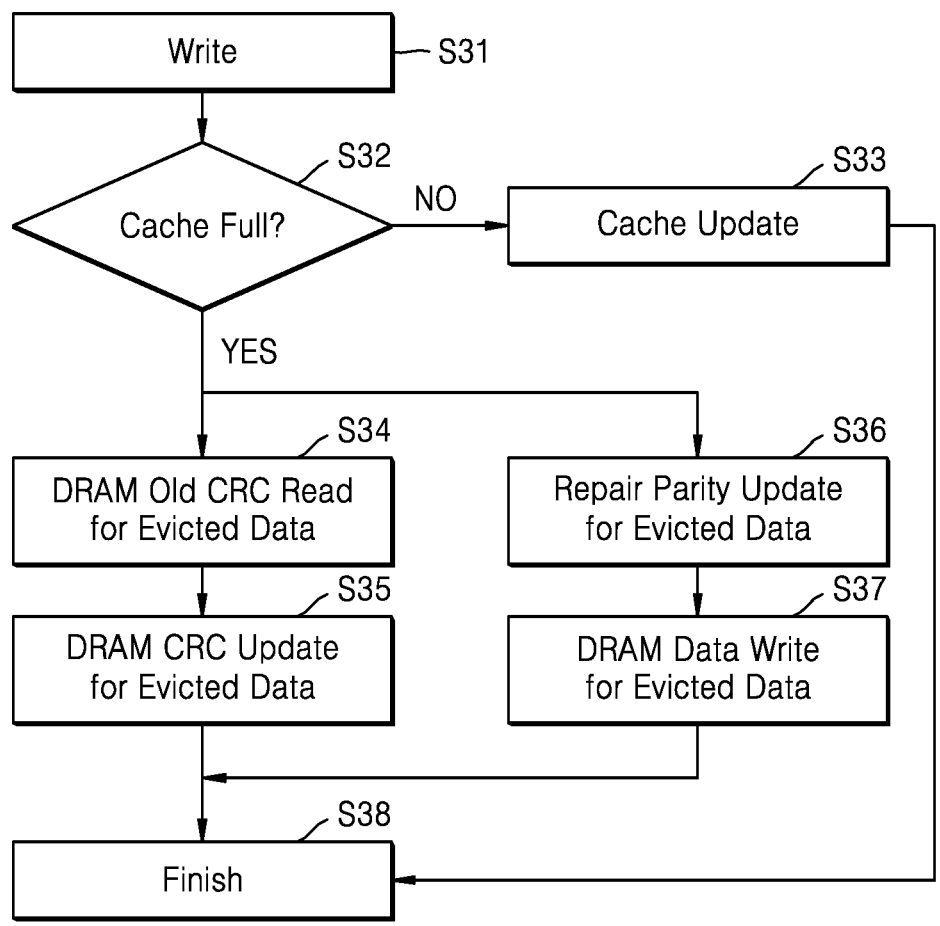
FIG. 11 is a flowchart of an operation method of a memory system, according to an exemplary embodiment of the inventive concept.

FIG. 11 is a flowchart of an operation method of a memory system, according to an exemplary embodiment of the inventive concept. FIG. 11 illustrates an operation of managing a parity, based on whether the storage space of a cache memory is entirely being used, and a memory device is assumed to be DRAM.

Referring to FIG. 11, in operation S31, a data write operation is requested by a host. In operation S32, it may be determined whether the storage space of the cache memory is entirely being used (or is the cache memory full) while write data is being temporarily stored in the cache memory. In operation S33, when an un-used storage space exists in the cache memory, the write data may be updated in the cache memory.

When there is no available storage space in the cache memory, various operations may be performed at the same time. For example, write data (for example, write data provided from the host at a previous write request) stored in the storage space of the cache memory may be evicted from the cache memory and provided to the DRAM. At this time, in operation S34, an existing CRC parity (or an old CRC parity) related to the evicted data may be read from the DRAM. In operation S35, the value of the CRC parity may be changed based on the evicted data, and a new CRC parity may be updated in the DRAM.

A repair parity corresponding to the evicted data may also be updated. For example, a new repair parity may be calculated via an operation using the evicted data and an existing repair parity and may be updated in a storage circuit of the memory controller, in operation S36. In operation S37, the evicted data may be written to the DRAM. New data provided in response to the write request in operation S31 may be stored in the storage space of the cache memory.

Figure 12:
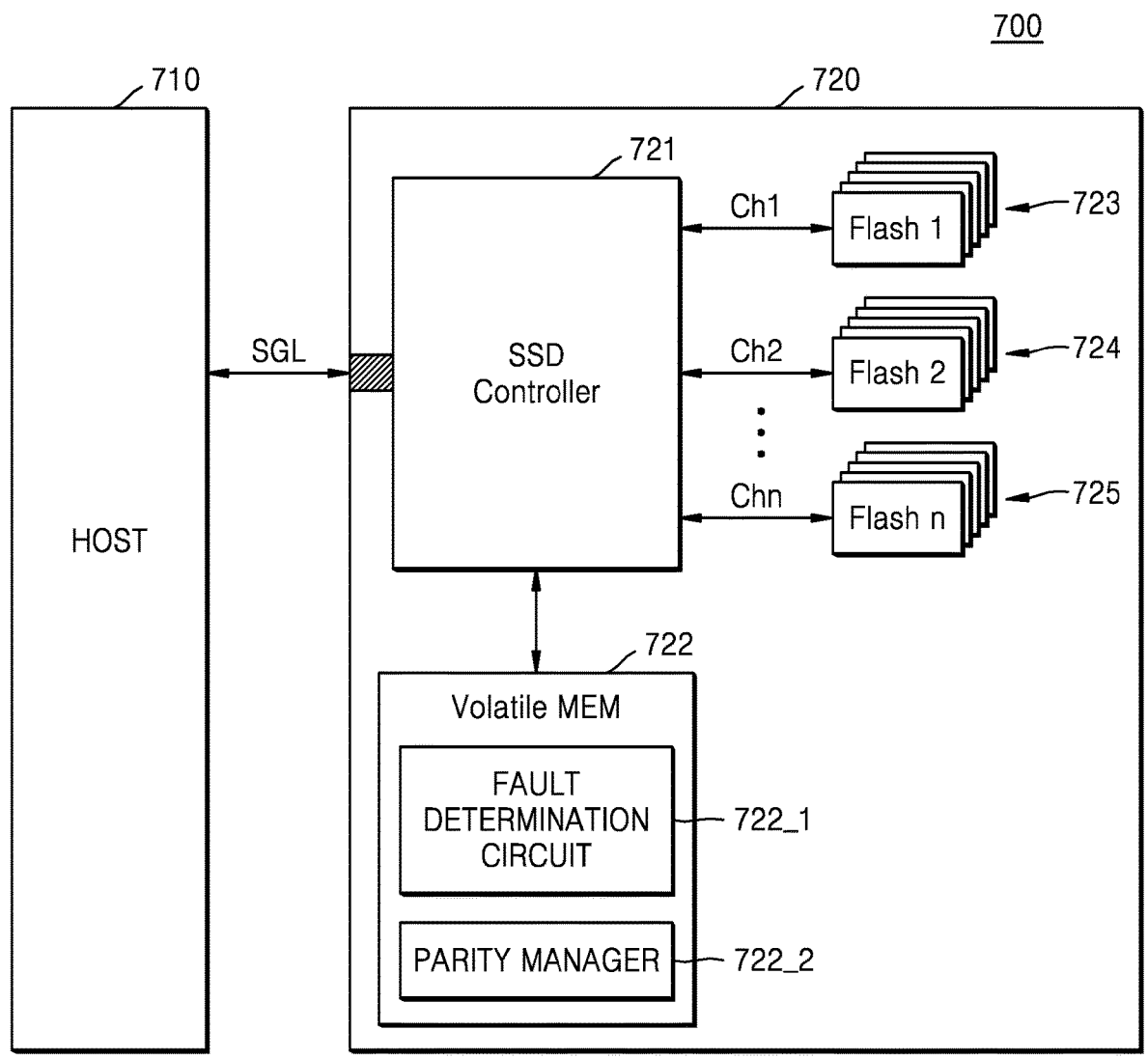
FIG. 12 is a block diagram of a solid-state drive (SSD) system to which memory devices according to exemplary embodiments of the inventive concept have been applied.

FIG. 12 is a block diagram of a solid-state drive (SSD) system 700 to which memory devices according to exemplary embodiments of the inventive concept have been applied.

Referring to FIG. 12, the SSD system 700 may include a host 710 and an SSD 720. The SSD 720 may transmit or receive signals SGL to or from the host 710 through a signal connector and may receive power through a power connector. The SSD 720 may include an SSD controller 721, a volatile memory 722, and a plurality of non-volatile memory systems 723, 724, and 725. The plurality of non-volatile memory systems 723, 724, and 725 may each include various types of non-volatile memory devices. In the example of FIG. 12, each of the non-volatile memory systems 723, 724, and 725 includes flash memory devices.

The SSD controller 721 may communicate with the non-volatile memory systems 723, 724, and 725 via a plurality of channels Ch1 through Chn, respectively, and, at a request from the host 710, may write data to the non-volatile memory systems 723, 724, and 725 or read data from the non-volatile memory systems 723, 724, and 725.

According to an exemplary embodiment of the inventive concept, the volatile memory 722 may include the memory devices according to the above-described embodiments, and thus the volatile memory 722 may include a fault determination circuit 722_1 and a parity manager 722_2. For example, the volatile memory 722 may include DRAM chips as one or more memory chips. Various devices such as a recovery circuit and a parity storage circuit may be further included as various other components according to the above-described embodiments.

Write data may be temporarily stored in the volatile memory 722 under the control of the SSD controller 721, or read data may be temporarily stored in the volatile memory 722. According to an exemplary embodiment of inventive concept, the volatile memory 722 may include a plurality of rows, may determine the existence or absence of a fault in units of rows, based on an error detect operation such as an ECC circuit and a CRC circuit, and may repair a faulty row determined in units of rows by performing a recovery algorithm using a repair parity.

Figure 13:
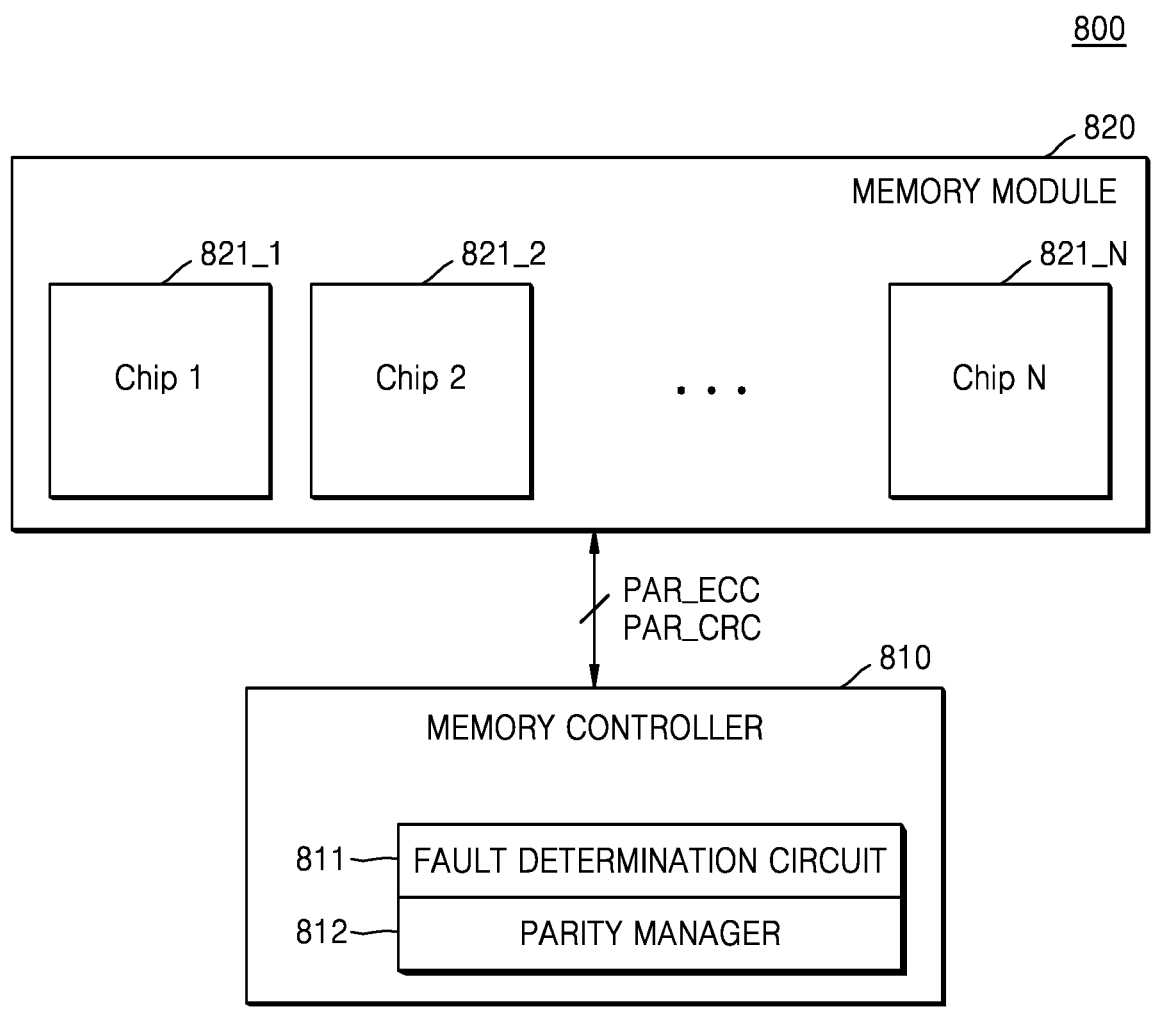
FIG. 13 is a block diagram of a memory system according to an exemplary embodiment of the inventive concept.

FIG. 13 is a block diagram of a memory system 800 according to an exemplary embodiment of the inventive concept. In FIG. 13, the memory system 800 includes a memory module 820 and a memory controller 810. The memory module 820 may include one or more memory chips 821_1 through 821_N as the memory devices according to the above-described embodiments.

Referring to FIG. 13, the memory controller 810 may control data write and read operations with respect to the memory chips 821_1 through 821_N included in the memory module 820. According to an exemplary embodiment of the inventive concept, the memory controller 810 may include a fault determination circuit 811 and a parity manager 812. The memory controller 810 may further include various other components such as a processor, a host interface (I/F) and a memory I/F, as components for controlling a memory operation.

The memory module 820 may include the one or more memory chips 821_1 through 821_N mounted on a module board, and each of the memory chips 821_1 through 821_N may correspond to the memory device according to the above-described embodiments. Accordingly, the memory chips 821_1 through 821_N may each include a plurality of rows, and may store data and also store various types of parities corresponding to the data. For example, the memory chips 821_1 through 821_N may each store the ECC parity PAR_ECC and the CRC parity PAR_CRC.

The fault determination circuit 811 may determine whether a row is faulty, by using the ECC parity PAR_ECC and the CRC parity PAR_CRC during a data read operation with respect to each of the memory chips 821_1 through 821_N, and the parity manager 812 may manage a repair parity that is used to repair a faulty row.

According to the present embodiment, the memory module 820 may be implemented using a single in-line memory module (SIMM) or a dual in-line memory module (DIMM). The memory module 820 may correspond to various types of DIMMs. For example, various types of DIMMs such as fully buffered (FB) FB-DIMMs and load reduced (LR) LR-DIMMs are applicable to the memory module 820. Alternatively, the memory module 820 may correspond to a non-volatile DIMM (NVDIMM) on which a non-volatile memory (for example, a flash memory) is mounted, to be used in place of volatile memory in which data is lost when power is terminated.

The memory module 820 may include DRAM chips as various types of modules, or may include resistive memory chips such as Magnetic RAM (MRAM), Ferroelectric RAM (FeRAM), Phase change RAM (PRAM), and Resistive RAM (ReRAM). When the memory module 820 includes PRAM as a resistive memory, the memory module 820 may be referred to as P_DIMM. Exemplary embodiments of the inventive concept are applicable to various types of modules. For example, the memory module 820 may include XPoint memory chips having three-dimensional (3D) resistive memory cells, and accordingly may be referred to as XPoint DIMM (or 3D XPoint DIMM).

Figure 14:
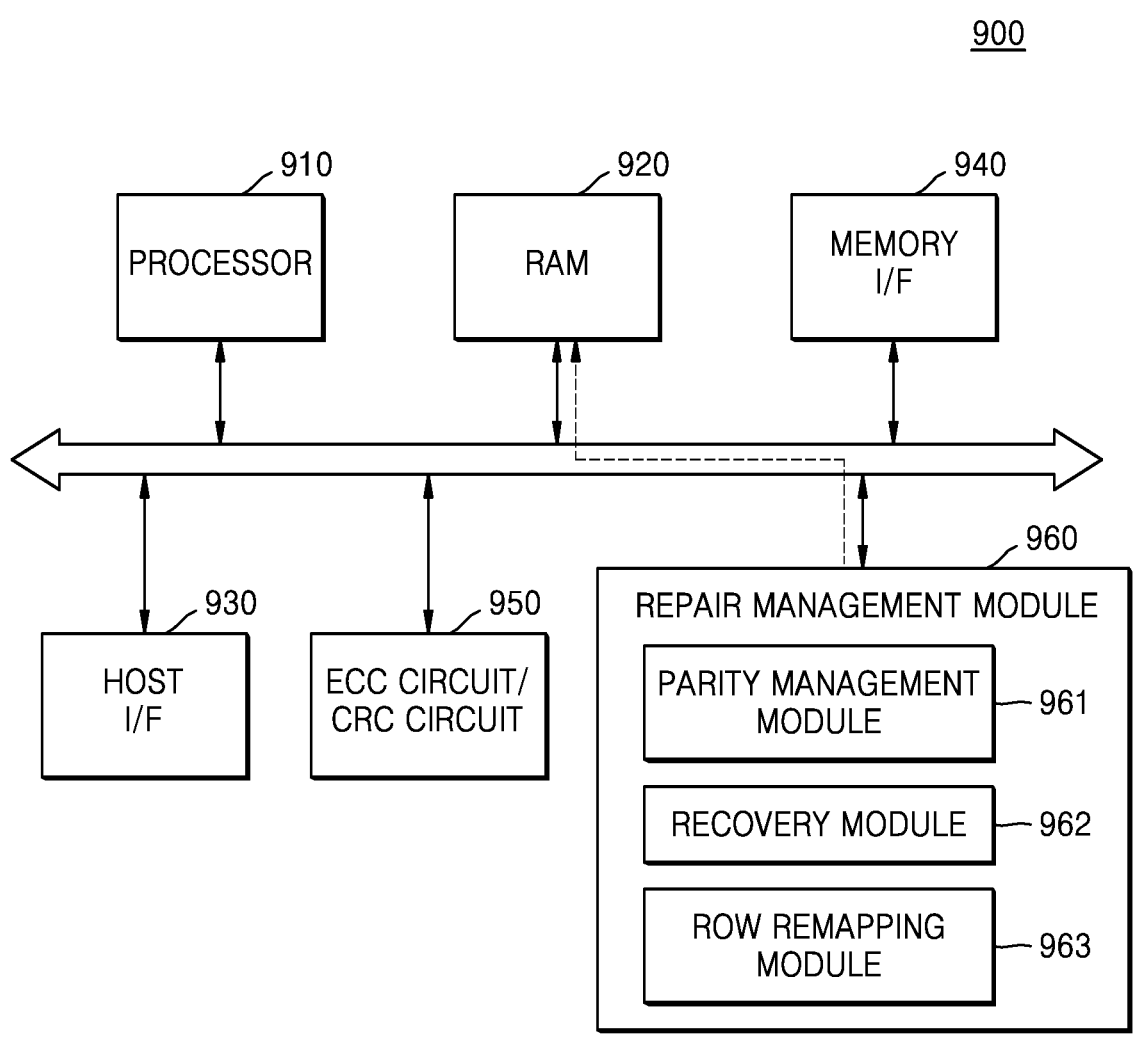
FIG. 14 is a block diagram of a memory controller according to an exemplary embodiment of the inventive concept.

FIG. 14 is a block diagram of a memory controller 900 according to an exemplary embodiment of the inventive concept.

Referring to FIG. 14, the memory controller 900 may include a processor 910, a RAM 920, a host I/F 930, a memory/F 940, an ECC circuit/CRC circuit 950, and a repair management module 960.

The processor 910 may include a central processing unit or a micro-processor, and may control an overall operation of the memory controller 900. For example, the processor 910 may be configured to drive software or firmware for controlling the memory controller 900. The software or firmware may be driven by being loaded in the RAM 920. The RAM 920 may be used as an operation memory, a cache memory, or a buffer memory of the processor 910. The RAM 920 may temporarily store write data that is to be written to a memory device, and may also temporarily store read data read out from the memory device.

The host I/F 930 interfaces with a host to receive a request for a memory operation from the host. The memory I/F 940 may provide an interface between the memory controller 900 and the memory device. For example, write data and read data may be transmitted or received to or from the memory device through the memory I/F 940. The memory I/F 940 may provide a command and an address to the memory device, receive various pieces of information from the memory device, and provide the various pieces of information to internal components of the memory controller 900.

The ECC circuit/CRC circuit 950 may perform the error detect operations according to the above-described embodiments. For example, the presence or absence of a fault may be determined in units of rows, based on a result of an error detection performed by the ECC circuit/CRC circuit 950. The repair management module 960 may perform a repair parity update operation at various times such as when data is loaded on the RAM 920 or data is provided to the memory device, and may perform a repair operation, based on a result of the fault determination made in units of rows.

According to an exemplary embodiment of the inventive concept, the repair management module 960 may perform various operations related to repairing in accordance with the above-described embodiments, based on a software method, and may include a parity management module 961, a recovery module 962, and a row remapping module 963. When operations according to exemplary embodiments of the inventive concept are performed based on a software method, each of the parity management module 961, the recovery module 962, and the row remapping module 963 may include programs executable by the processor 910, and the programs may be loaded on the RAM 920 and executed by the processor 910.

Figure 15:
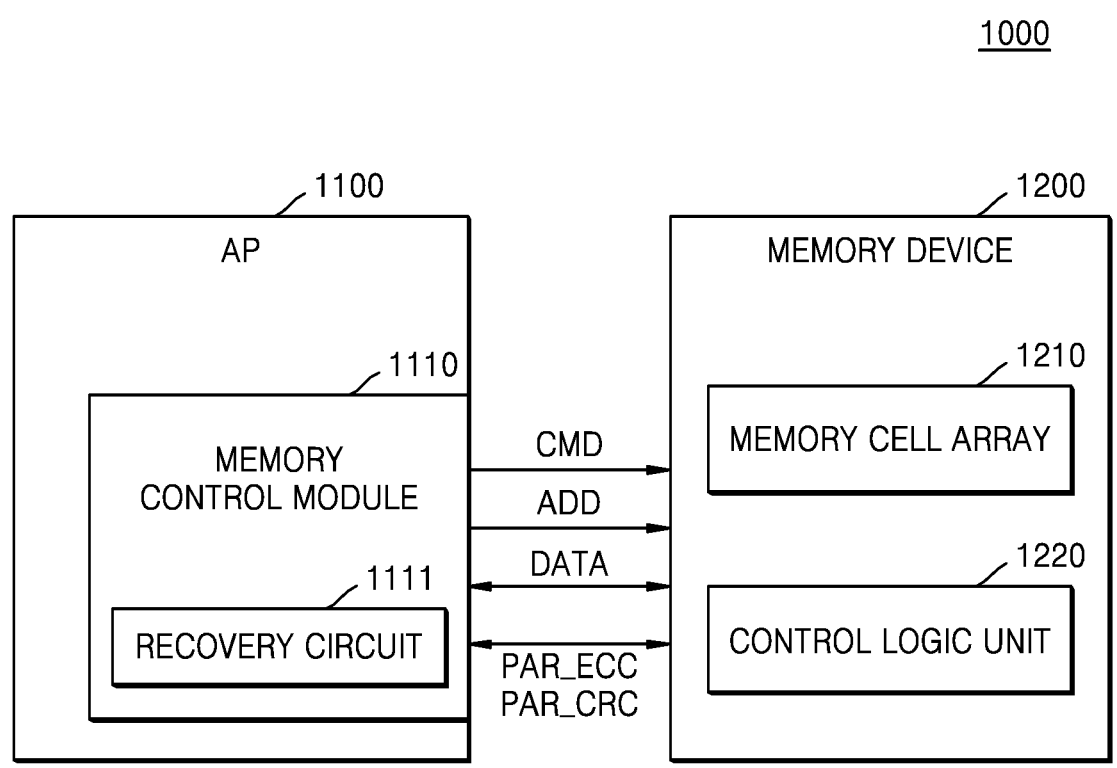
FIG. 15 is a block diagram of a memory system according to another exemplary embodiment of the inventive concept.

FIG. 15 is a block diagram of a memory system according to another exemplary embodiment of the inventive concept. FIG. 15 illustrates a data processing system 1000 including an application processor (AP) 1100 and a memory device 1200, and a memory control module 1110 within the AP 1100 and the memory device 1200 may constitute a memory system. A command CMD, an address ADD, and data DATA may be transmitted or received between the memory control module 1110 and the memory device 1200, and the memory device 1200 may include a memory cell array 1210 and a control logic unit 1220. The memory control module 1110 may include a memory controller illustrated in the above-described embodiments. Accordingly, the memory control module 1110 may include a recovery circuit 1111, and may further include various components related to the error detection and the repair parity management presented above in the above-described embodiments.

The AP 1100 may be implemented by using a system on chip (SoC). The SoC may include a system bus to which a protocol having a certain bus standard has been applied, and may include various types of Intellectual Property (IP) devices that are connected to the system bus. An Advanced Microcontroller Bus Architecture (AMBA) protocol by the Advanced RISC Machine (ARM) may be applied as a standard of the system bus. Examples of bus types of the AMBA protocol may include an Advanced High-Performance Bus (AHB), an Advanced Peripheral Bus (APB), an Advanced eXtensible Interface (AXI), AXI4, and AXI Coherency Extensions (ACE). Besides them, other types of protocols, such as uNetwork by SONICs Inc., CoreConnect by IBM, and an Open Core Protocol by OCP-IP, are applicable.

The memory device 1200 may perform an operation related to the error detection presented above in the above-described embodiments. For example, the memory device 1200 may receive and store the ECC parity PAR_ECC and the CRC parity PAR_CRC. The memory control module 1110 may determine whether a row is faulty, based on the ECC parity PAR_ECC and the CRC parity PAR_CRC, and the recovery circuit 1111 may perform a recovery operation for repairing the fault of a row.

While the inventive concept has been particularly shown and described with reference to exemplary embodiments thereof, it will be understood that various changes in form and details may be made thereto without departing from the spirit and scope of the inventive concept as set forth by the following claims.

What is claimed is:

1. A memory controller for communicating with a memory device including one or more memory chips, the memory controller comprising:
a fault determination circuit configured to receive a first parity, a second parity, and data read out from a first row of one memory chip of the memory device, and determine, based on a result of a first error detection operation using the first parity and a result of a second error detection operation using the second parity, whether the first row is faulty;
a parity storage circuit configured to store a repair parity for repairing a fault of a row of a plurality of rows of the one memory chip of the memory device, wherein the plurality of rows of the one memory chip constitutes a repair unit, and wherein the repair unit includes the first row and one or more second rows; and a recovery circuit configured to repair a fault of the first row by using data of at least one of the second rows and the repair parity, when the first row is determined to be a faulty row, wherein a size of the repair unit is larger than a size of a unit for determining whether the first row is faulty, and wherein the repair parity is read from the parity storage circuit within the memory controller and provided to the recovery circuit.

2. The memory controller of claim 1, wherein
the first parity is an error-correcting code (ECC) parity that is generated by an ECC circuit, and
the second parity is a cyclic redundancy check (CRC) parity that is generated by a CRC circuit.

3. The memory controller of claim 2, wherein
when an error of two or more bits is detected in the first error detection operation using the ECC parity or an error is detected in the second error detection operation using the CRC parity, the fault determination circuit determines that the first row is the faulty row.

4. The memory controller of claim 2, wherein
when an error is detected in the second error detection operation using the CRC parity, the fault determination circuit determines that the first row is the faulty row.

5. The memory controller of claim 2, wherein
the first error detection operation using the ECC parity performs error detection with respect to data of one row, and
the second error detection operation using the CRC parity performs error detection with respect to data of two or more rows.

6. The memory controller of claim 1, further comprising:
a parity managing circuit configured to generate the repair parity and manage an update operation with respect to the repair parity when a memory operation with respect to the memory device is performed.

7. The memory controller of claim 6, wherein
in a data read process with respect to the memory device, read data is temporarily stored in a cache memory, and
when the data read out from the first row is loaded into the cache memory in the data read process, the parity managing circuit generates a new repair parity using the data read out from the first row and a repair parity corresponding to an old parity, and updates the parity storage circuit with the new repair parity.

8. The memory controller of claim 7, wherein
as the data read out from the first row is loaded into the cache memory, the first row is removed from the repair unit and the new repair parity has information used to repair faults of the remaining rows of the repair unit.

9. The memory controller of claim 6, wherein
in a data write process with respect to the memory device, write data is temporarily stored in a cache memory, and
when storage of write data in the first row is requested, the parity managing circuit generates a new first repair parity using data pre-stored in the first row and a repair parity corresponding to an old parity and updates the parity storage circuit with the new first repair parity.

10. The memory controller of claim 9, wherein
as the write data for the first row is loaded into the cache memory, the first row is removed from the repair unit and the new first repair parity has information used to repair faults of the remaining rows of the repair unit.

11. The memory controller of claim 9, wherein
when write data for the first row loaded into the cache memory is evicted, the parity managing circuit generates a new second repair parity using the write data for the first row and the new first repair parity and updates the parity storage circuit with the new second repair parity.

12. The memory controller of claim 1, wherein
when the first row is the faulty row, the memory controller controls repaired data of the first row to be stored in a third row of the one memory chip of the memory device, and
the memory controller further comprises a row remapping circuit configured to transform an address indicating the first row into an address indicating the third row and store the address indicating the third row.

13. An operation method of a memory controller, the memory controller communicating with a memory device including one or more memory chips, the operation method comprising:
receiving a write request and write data for a first row of one memory chip of the memory device from a host;
generating, from the write data, first parity for use in a first error detection operation and second parity for use in a second error detection operation;
storing the first parity and the second parity in the one memory chip of the memory device;
generating a repair parity for repairing a default of each row of a repair unit using the write data, wherein the repair unit includes the first row and one or more second rows of the one memory chip;
storing the repair parity in a parity storage circuit within the memory controller;
determining whether the first row is faulty, based on a result of an error detection operation using the first and second parities, when a read request for the first row is received from the host; and
repairing, by a recovery circuit, a fault of the first row by performing a recovery algorithm using data of the one or more second rows of the repair unit and the repair parity, when the first row is determined to be faulty,
wherein a size of the repair unit is larger than a size of a unit for determining whether the first row is faulty, and
wherein the repair parity is read from the parity storage circuit within the memory controller and provided to the recovery circuit.

14. The operation method of claim 13, wherein
the first parity is an error-correcting code (ECC) parity that is generated by an ECC circuit, and the second parity is a cyclic redundancy check (CRC) parity that is generated by a CRC circuit.

15. The operation method of claim 14, wherein
in the determining of whether the first row is faulty, when an error of two or more bits is detected in the first error detection operation or an error is detected in the second error detection operation, it is determined that the first row is faulty.

16. A memory system, comprising:
a memory device including one or more memory chips and comprising a memory cell array including a first region for storing normal data and a second region for storing parities; and
a memory controller configured to control a memory operation of the memory device,
wherein the memory controller comprises:
a fault determination circuit configured to receive a first parity for use in a first error detection operation, a second parity for use in a second error detection operation, and data read from a first row of one memory chip of the memory device, and determine, based on a result of the first error detection operation and a result of the second error detection operation, whether the first row is faulty;

a parity storage circuit configured to store a repair parity for repairing a fault of each row of a repair unit including the first row and one or more second rows of the one memory chip; and a recovery circuit configured to repair a fault of the first row by using data of at least one of the second rows and the repair parity, when the first row is determined to be a faulty row, wherein a size of the repair unit is larger than a size of a unit for determining whether the first row is faulty, and wherein the repair parity is read from the parity storage circuit within the memory controller and provided to the recovery circuit.

17. The memory system of claim 16, wherein
the first parity is a cyclic redundancy check (CRC) parity that is generated by a CRC circuit,
the second parity is an error-correcting code (ECC) parity that is generated by an ECC circuit, and
the ECC parity and the CRC parity are stored in the second region.

18. The memory system of claim 16, wherein
the memory controller further comprises a parity management circuit configured to generate a repair parity corresponding to the repair unit and manage an update operation with respect to the repair parity when a memory operation with respect to the memory device is performed.

19. The memory system of claim 18, wherein
the memory system further comprises a cache memory, and
the parity management circuit omits an update operation with respect to the repair parity when data stored in the cache memory is provided to a host according to a cache hit during a data read process, and performs an update operation with respect to the repair parity when the data stored in the memory device is moved to the cache memory.

* * * * *